United States Patent [19]

Jacobs

[11] 4,316,196

[45] Feb. 16, 1982

[54] ILLUMINATION AND LIGHT GATE UTILIZATION METHODS AND APPARATUS

[75] Inventor: John H. Jacobs, Altadena, Calif.

[73] Assignee: Bell & Howell Corporation, Chicago, Ill.

[21] Appl. No.: 24,486

[22] Filed: Mar. 27, 1979

Related U.S. Application Data

[60] Division of Ser. No. 925,132, Jul. 17, 1978, abandoned, which is a continuation of Ser. No. 776,157, Mar. 10, 1977, abandoned.

[51] Int. Cl.$^3$ .................................................. G01D 15/14
[52] U.S. Cl. ..................................... 346/1.1; 346/108; 350/356; 350/393
[58] Field of Search .................... 346/108, 107 R, 1.1; 350/356, 150, 389, 392, 393; 354/227, 4, 5; 365/117; 358/213

[56] References Cited

U.S. PATENT DOCUMENTS

| | | | |
|---|---|---|---|
| 2,649,027 | 8/1953 | Mason | 346/107 R X |
| 2,960,914 | 11/1960 | Rogers | 350/150 |
| 3,453,561 | 7/1969 | Bonner | 350/150 |
| 3,555,987 | 1/1971 | Browning | 350/150 X |
| 3,841,733 | 10/1974 | Ebersole | 346/108 X |
| 3,930,119 | 12/1975 | Schmidt | 350/356 X |

OTHER PUBLICATIONS

Drake, M. D.; PLZT Matrix-Type Block Data Composers; Applied Optics, vol. 13, No. 2, Feb. 1974, pp. 347-352.

Cutchen et al., PLZT Electrooptic Shutters:Applications Applied Optics, vol. 14, No. 8, Aug. 1975, pp. 1866-1873.

Primary Examiner—Joseph W. Hartary
Attorney, Agent, or Firm—Benoit Law Corporation

[57] ABSTRACT

Methods and apparatus for recording varying electric signals with a plurality of electrically actuable light gates illuminate the light gates with light of a first intensity above zero light intensity and provide a light-sensitive recording medium sensitive to illumination levels at light intensities including the mentioned first light intensity and starting at a second light intensity below such first intensity and above zero light intensity. These methods and apparatus precondition the light gates to subsequent opening in response to varying electric signals by electrically biasing the light gates to an initially open condition wherein the gates pass light from the mentioned illumination at an intensity below the second light intensity. The recording medium is thus exposed to light passed by the preconditioned gates at below the second intensity. Thereafter, the preconditioned light gates are selectively energized and further opened in response to varying electric signals to pass light at at least the second light intensity for a recording of such electric signals on the recording medium. The same principle may be employed for reading information with the aid of electrically controlled light gates.

8 Claims, 23 Drawing Figures

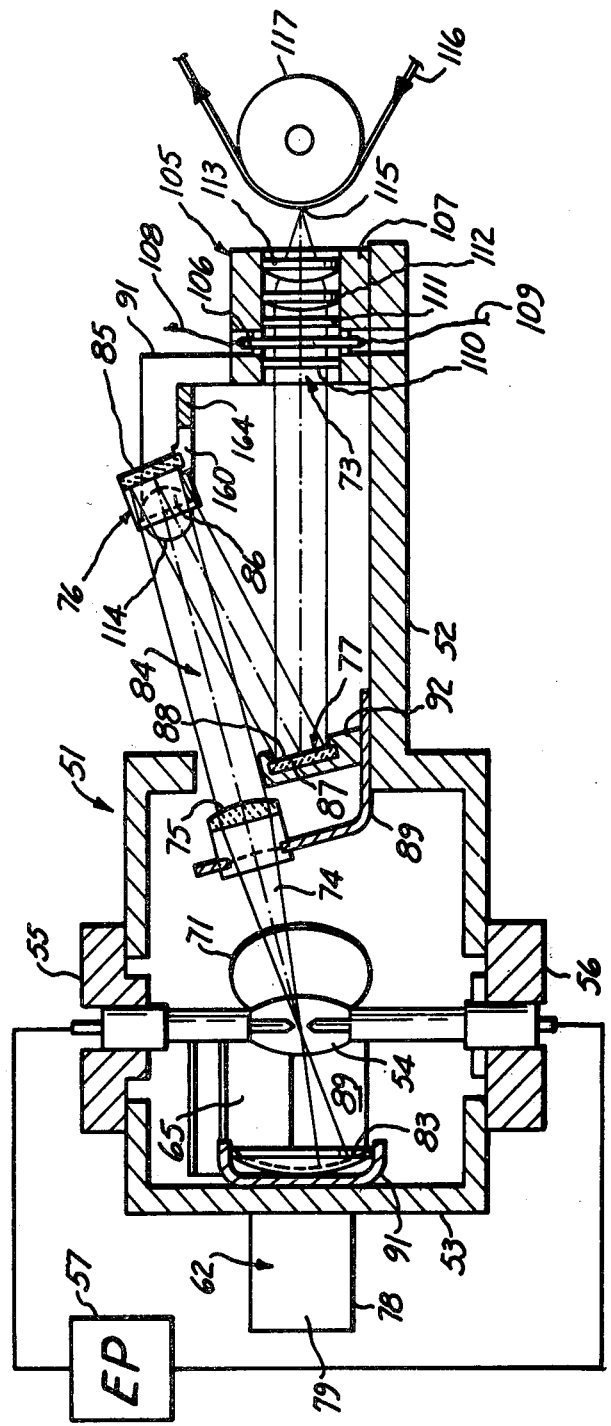

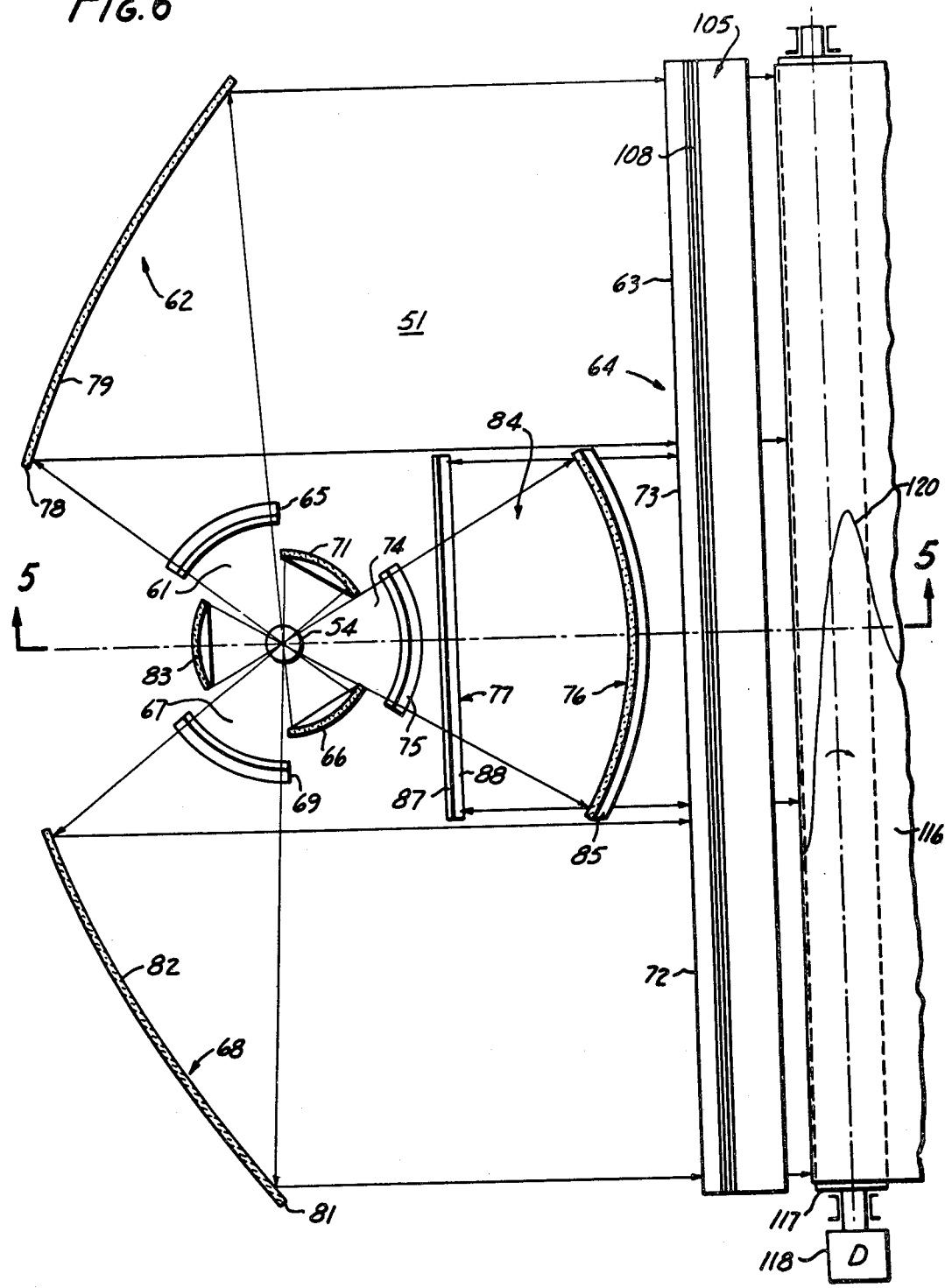

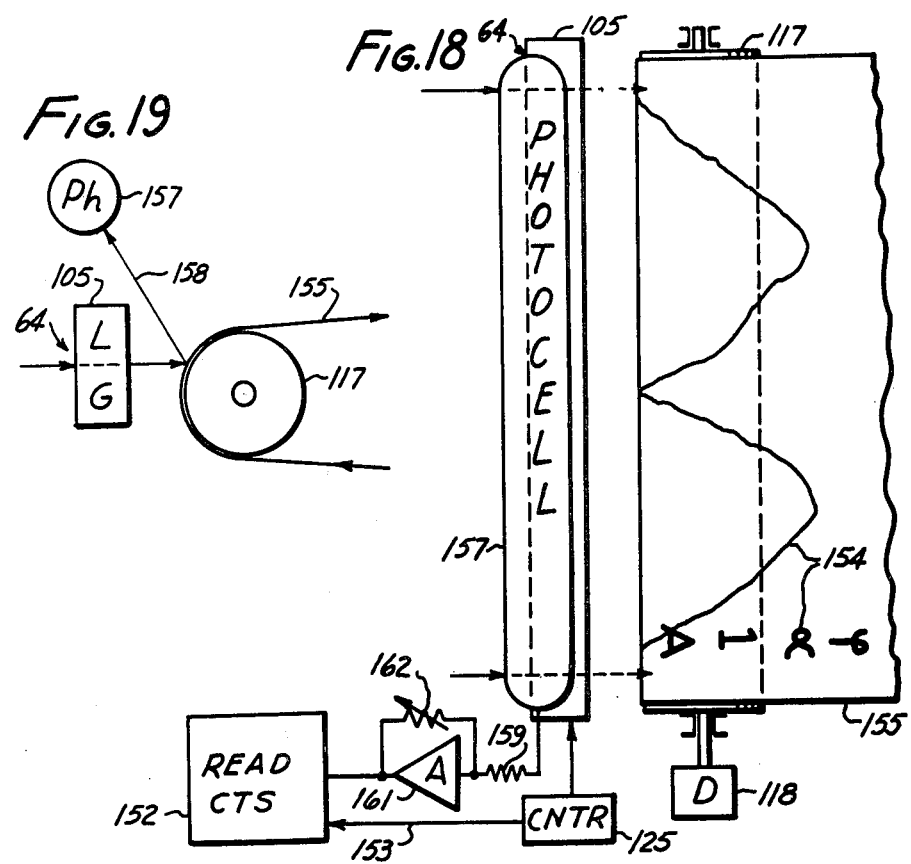
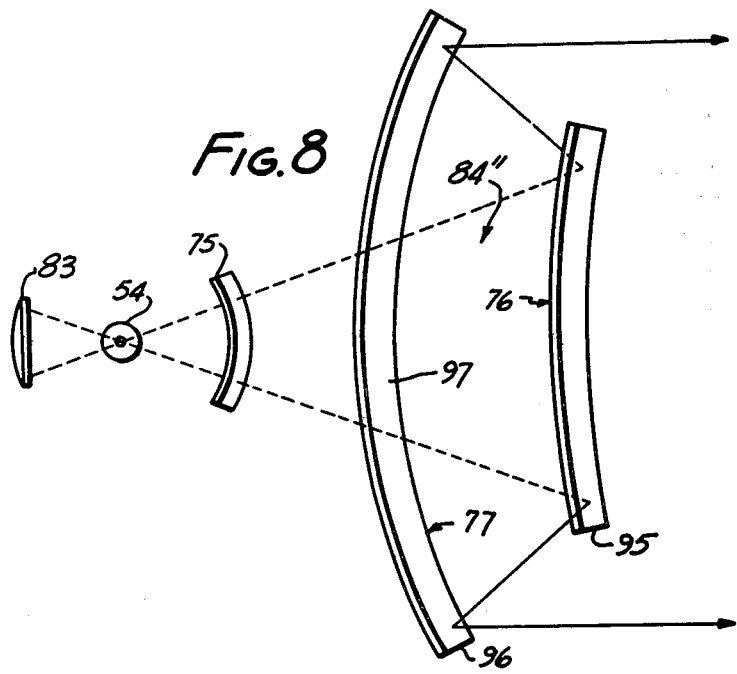

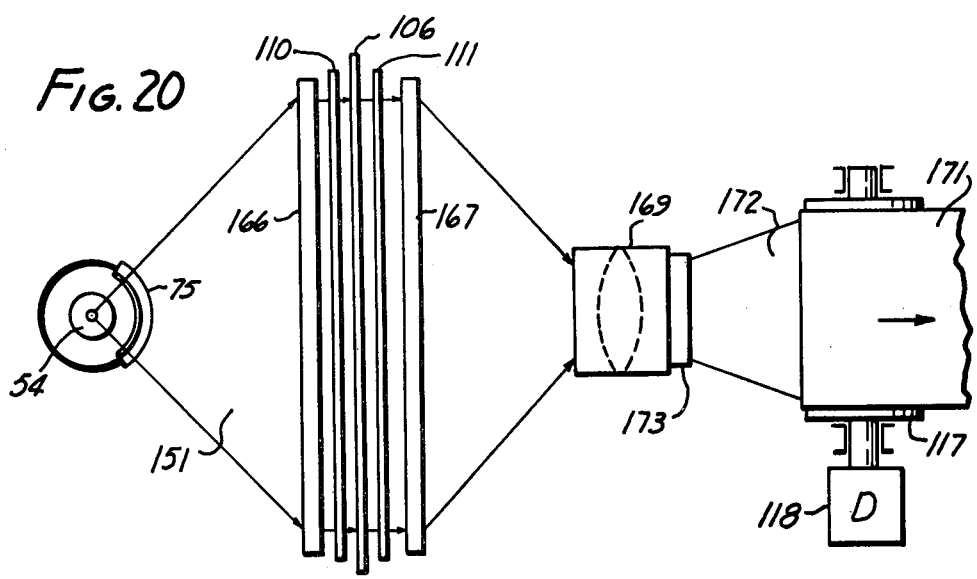
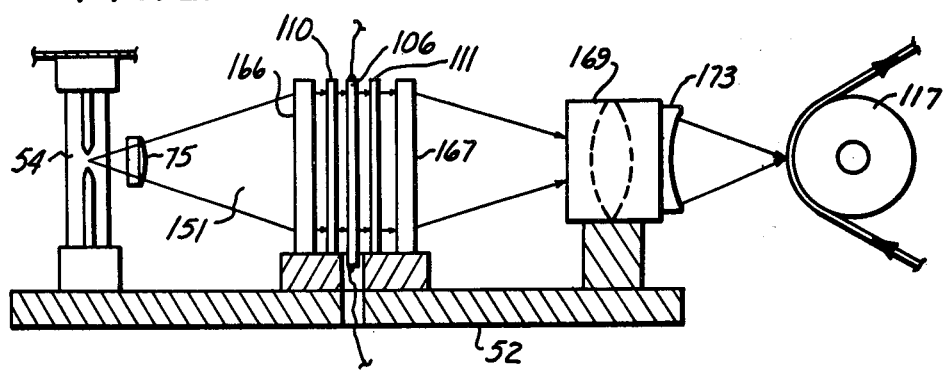
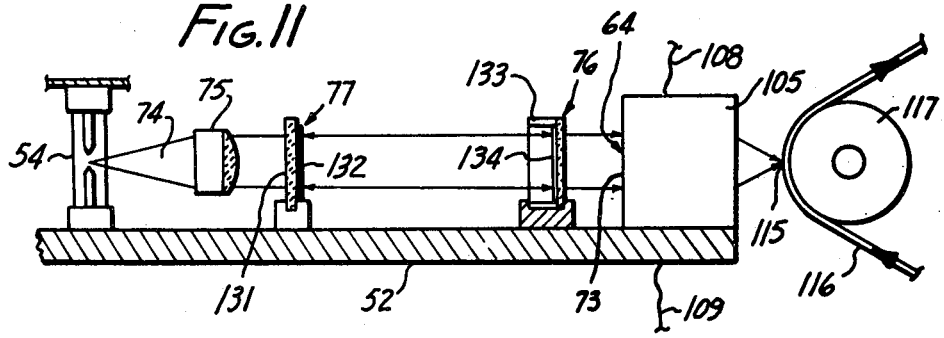

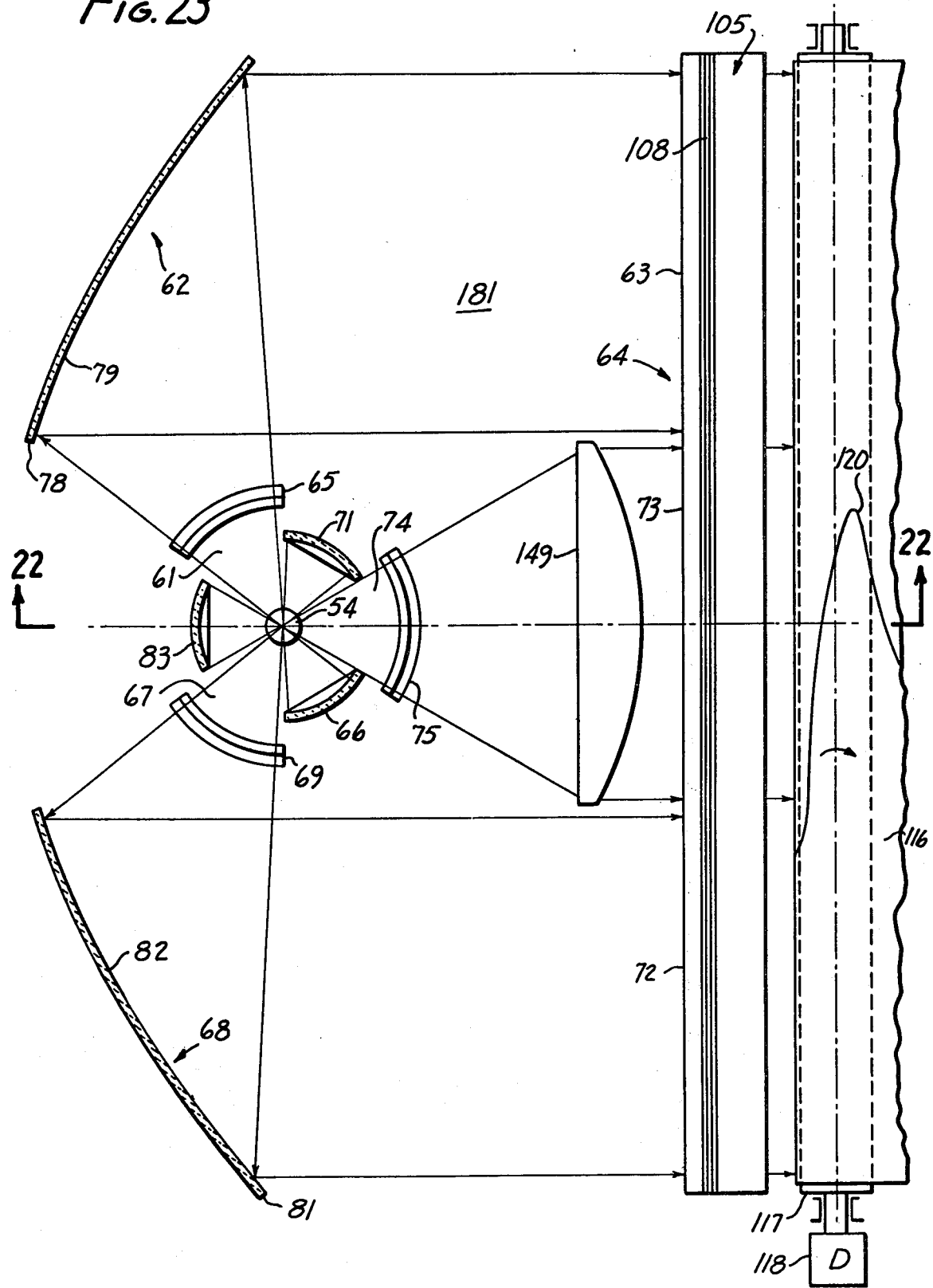

ILLUMINATION AND LIGHT GATE UTILIZATION METHODS AND APPARATUS

CROSS-REFERENCE

This is a division of U.S. patent application Ser. No. 925,132, filed July 17, 1978 for ILLUMINATION AND LIGHT GATE UTILIZATION METHODS AND APPARATUS, now abandoned which was a continuation of U.S. patent application Ser. No. 776,157, filed Mar. 10, 1977 for LIGHT GATE UTILIZATION METHODS AND APPARATUS now abandoned, by John H. Jacobs, and assigned to the subject assignee.

BACKGROUND OF THE INVENTION

1. Field of the Invention

The subject invention relates to light gate utilization methods and apparatus, and extends in its utility to methods and apparatus for recording varying electrical signals and methods and apparatus for reading information with the aid of light gates. Examples of such apparatus include solid state oscillographs and solid state facsimile equipment.

The subject invention also relates to increased-density electrode arrays, to optical systems for converting a spatially concentrated light output into a band of light, and to electro-optical systems for modulating a light output.

2. Description of the Prior Art

A family of ferroelectric electro-optic ceramics is known as PZT compounds with P standing for lead, Z for zirconium and T for titanium. Under the influence of an electrical field, PZT compounds become birefringent and exhibit various electro-optic properties. For instance, incoming light is resolved into two component waves propagating at different velocities and in polarization planes that are at right angles to each other. The magnitude of the effect is a function of the applied voltage and of the light frequency. Light valves and gates may be provided by placing the electro-optic ceramic between a polarizer plate and an analyzer plate.

A breakthrough occurred with the discovery that substitution of small amounts of lanthanum greatly improves ferroelectric properties. These improved compounds generally have become known as PLZT compounds, with the L standing for lanthanum.

Reference may in this respect be had to Land et al, Ferroelectric Ceramic Electrooptic Materials and Devices, 57 Proceedings IEEE No. 5, May 1969, pp. 751 to 768, Thacher et al, Ferroelectric Electrooptic Ceramics with Reduced Scattering, ED-16, IEEE Transactions on Electron Devices, No. 6, June 1969, pp. 515 to 521, Maldonado et al, Ferroelectric Ceramic Light Gates Operated in a Voltage-Controlled Mode, ED-17, IEEE Transactions on Electron Devices, No. 2, February 1970, pp. 148 to 157, New Ferroelectric Ceramics Enhance Electro-Optic Performance, Design News, June 22, 1970, pp. 10 and 11, Haertling et al, Hot-Pressed (Pb, La) (Zr, Ti) $O_3$ Ferroelectric Ceramics for Electrooptic Applications, 54 Journal of The American Ceramic Society, No. 1, January 1971, pp. 1 to 11, Waterworth et al, Integrated Electro-Optic Modulator Arrays, 4 Optoelectronics (1972) 339 and 340, Cutchen et al, Electrooptic Devices Utilizing Quadratic PLZT Ceramic Elements, 30, 1973 Wescon Technical Papers, Vol. 17 pp. 1 to 12, Zook, Light Beam Deflector Performance: a Comparative Analysis, 13 APPLIED OPTICS, No. 4, April 1974, pp. 875 et seq., Fiber Display Features Digital Scanning, Optical Spectra, June 1974, and Cutchen et al, PLZT Electrooptic Shutters: Applications, 14 APPLIED OPTICS, No. 8, August 1975, pp. 1866 to 1873.

In the course of such development, replacement of Kerr cells in such applications as constant-density trace oscillographs disclosed in U.S. Pat. No. 3,354,465 by Merritt et al, issued Nov. 21, 1967, were replaced by solid-state light valves. Indeed, solid-state shutter systems were among the first practical applications as may, for instance, be seen from U.S. Pat. No. 3,555,987, by Iben Browning, issued Jan. 19, 1971. The switching properties and modes of ferroelectric ceramic plates were recognized and published such as in the above mentioned 1969 IEEE article by Land et al, pp. 61 and 762 and FIG. 20, and proposals for practical applications such as those suggested in the above mentioned U.S. Pat. No. 3,930,119, by Schmidt et al, issued Dec. 30, 1975, naturally followed.

Similarly, PLZT electro-optic modulator arrays of the type disclosed in the above mentioned 1972 Optoelectronics letter by Waterworth et al have been considered suitable as the light modulating agency in a solid state oscillograph. In a similar vein, a PLZT device has been considered as an electrooptic shutter in an oscillograph of the Type 5-134 and the Type 5-139 manufactured by the subject assignee.

These installations, of course, still operated with conventional galvanometer mirrors, leaving unsatisfied the need for a solid state recording oscillograph using a PLZT or other type of solid state light gate structure. However, the prior art was notoriously unable to overcome various obstacles, entrenched prejudices and inadequacies which remained in the way of competitive solid state oscillograph and facsimile writing and reading equipment.

This will presently be explained with the aid of the above mentioned U.S. Pat. No. 3,930,119, by Schmidt et al, issued Dec. 30, 1975. It is to be pointed out in this connection that the problems presently to be discussed are endemic to the prior art and that the Schmidt patent has been selected as a convenient basis for discussion because of its symptomatic nature and relatively recent date.

One of the prevailing problems becomes apparent from a consideration of the fact that an effective light gating action requires each electrode or at least one electrode of each electrode pair to be individually connected to its own electric energizing wire. In this respect, several electrodes per millimeter have to be provided for adequate resolution. By way of example, Schmidt et al mention an array of 1,200 lines of 800 picture elements each. At such high densities, the requisite individual terminal for each electrode becomes larger than the electrode itself, as may be seen from FIG. 12 on page 1871 of the above mentioned Cutchen article entitled PLZT Electrooptic Shutters: Applications. Accordingly, the inevitable minimum terminal size in practice is the limiting factor of electrode density and scanning or picture element resolution.

Another problem stems from the high light indensity required for solid state light gate operations. While arc lamps and other high-indensity or point-type light sources exist, the problem becomes acute when an elongate light gate array is to be illuminated for selective light transmission. In this respect, the above mentioned Schmidt et al patent proposes use of a tubular light source coextensive with the longest dimension of the light gate array and providing a uniform illumination there across. No existing light source having such elongate, coextensive configuration and meeting the applicable collimation requirements could be found.

In a similar vein, the well-known light scattering properties of PLZT and other solid state light gates, coupled with the natural difraction imposed on light coming through a multitude of narrow light gates, impose strict requirements, including collimation in two crossed directions to avoid sideways spread of the recording or illuminated reading point and to facilitate focusing of gated light to a small spot in the direction of travel of the recording medium or the master to be read.

Such bidirectional collimation appears lacking from the Schmidt et al proposal. No remedy for this defect could be found in the remainder of the above mentioned references.

SUMMARY OF THE INVENTION

It is a general object of this invention to overcome the above mentioned disadvantages.

It is also an object of this invention to increase feasible electrode density in elecrode structures and to provide articles of manufacture having such increased electrode density.

It is a related object of this invention to provide increased electrode and gatable element densities in light gate structures.

It is also an object of this invention to provide improved apparatus and methods for recording varying electric signals.

It is also an object of this invention to provide improved methods and apparatus for reading information perceptible upon illumination.

It is a related object of this invention to provide improved methods and apparatus for modulating light from a spatially concentrated source of divergent light.

It is a germane object of this invention to improve the performance and utility of various PLZT and other solid state devices.

Other objects of the invention will become apparent in the further course of this disclosure.

From another aspect thereof, the subject invention resides in a method of recording varying electric signals with a plurality of electrically actuable light gates and, more specifically, resides in the improvement comprising in combination the steps of illuminating the light gates with light of a first intensity above zero light intensity, providing a light-sensitive recording medium sensitive to illumination levels at light intensities including the first light intensity and starting at a second light intensity below the first intensity and above zero light intensity, preconditioning the light gates to subsequent opening in response to the varying electric signals by electrically biasing the light gates to an initially open condition wherein the gates pass light from the illumination at an intensity above zero light intensity and below the second light intensity, exposing the recording medium to the light passed by the preconditioned gates in the initially open condition whereby the recording medium is exposed to light below the second intensity, selectively energizing and further opening the preconditioned light gates in response to the varying electric signals to pass light from the illumination at at least the second light intensity and provide a luminous representation of the varying electric signals, and exposing the recording medium to the passed illumination at at least the second light intensity and recording the luminous representation of the varying electric signals on the recording medium.

From another aspect thereof, the subject invention resides in a method of reading information from a record with the aid of a plurality of electrically controlled light gates and, more specifically, resides in the improvement comprising in combination the steps of illuminating the light gates with light of a first intensity above zero light intensity, preconditioning the light gates to subsequent opening in response to electric control signals by electrically biasing the light gates to an initially open condition wherein the gates pass light from the illumination at an intensity above zero light intensity and below a second intensity lower than the first intensity, subjecting the record to a first illumination by the light of an intensity above zero light intensity and below the second intensity as passed by the preconditioned gates in the initially open condition, subjecting the record to a second illumination by further opening the preconditioned light gates in response to electric control signals to pass light at at least the second light intensity and scanning the record with the passed light at at least the second intensity, and reading information from the record only in response to the second illumination as among the first and second illuminations.

From another aspect thereof, the subject invention resides in apparatus for recording varying electric signals and, more specifically, resides in the improvement comprising, in combination, a plurality of electrically actuable light gates, means for illuminating the light gates with light of a first intensity above zero light intensity, a light-sensitive recording medium sensitive to illumination levels at light intensities including the first light intensity and starting at a second light intensity below the first intensity and above zero light intensity, means connected to the light gates for preconditioning the light gates to subsequent opening in response to the varying electric signals, the preconditioning means including means for electrically biasing the light gates to an initially open condition wherein the gates pass light from the illumination at an intensity above zero light intensity and below the second light intensity, means connected to the light gates for selectively energizing and further opening the preconditioned light gates in response to the varying electric signals to pass light from the illumination at at least the second light intensity and provide a luminous representation of the varying electric signals, and means for exposing the recording medium to the light passed by the preconditioned gates in the initially open condition whereby the recording medium is exposed to light below the second intensity and to the passed illumination at at least the second light intensity and recording the luminous representation of the varying electric signals on the recording medium.

From another aspect thereof, the subject invention resides in apparatus for reading information from a record and, more specifically, resides in the improvement comprising, in combination, a plurality of electrically controlled light gates, means for illuminating the light gates with light of a first intensity above zero light intensity, means for preconditioning the light gates to subsequent opening in response to electric control signals, the preconditioning means including means for electrically biasing the light gates to an initially open condition wherein the gates pass light from the illumination at an intensity above zero light intensity and below a second intensity lower than the first intensity, means for subjecting the record to a first illumination by the light of an intensity above zero light intensity and below the second intensity as passed by the preconditioned gates in the initially open condition, and for subjecting the record to a second illumination, including means for further opening the preconditioned light gates in response to electric control signals to pass light at at least the second light intensity and for scanning the record with the passed light at at least the second intensity, means for reading information from the record in response to the second illumination, and means connected to the reading means for inhibiting a response by the reading means to the first illumination.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or functionally equivalent parts, and in which:

FIG. 5 is a section, taken along the line 5-5 in FIG. 6, of a solid state oscillograph apparatus which may incorporate a preferred embodiment of the subject invention;

FIG. 6 is a top view of the apparatus of FIG. 5;

FIG. 8 is a top view of a second modification of the apparatus shown in FIGS. 5 and 6;

FIG. 11 is an elevation, partially in section of a further modification of the apparatus shown in FIGS. 5 and 6;

FIG. 18 is a top view of part of a facsimile or document reading apparatus incorporating a preferred embodiment of the subject invention;

FIG. 19 is a side view of the apparatus shown in FIG. 18;

FIG. 20 is a top view of a micro-imaging apparatus which may incorporate a preferred embodiment of the subject invention;

FIG. 21 is a side view of the apparatus shown in FIG. 20;

FIG. 23 is a top view of the apparatus of FIG. 22.

DESCRIPTION OF PREFERRED EMBODIMENTS

Figure 1:
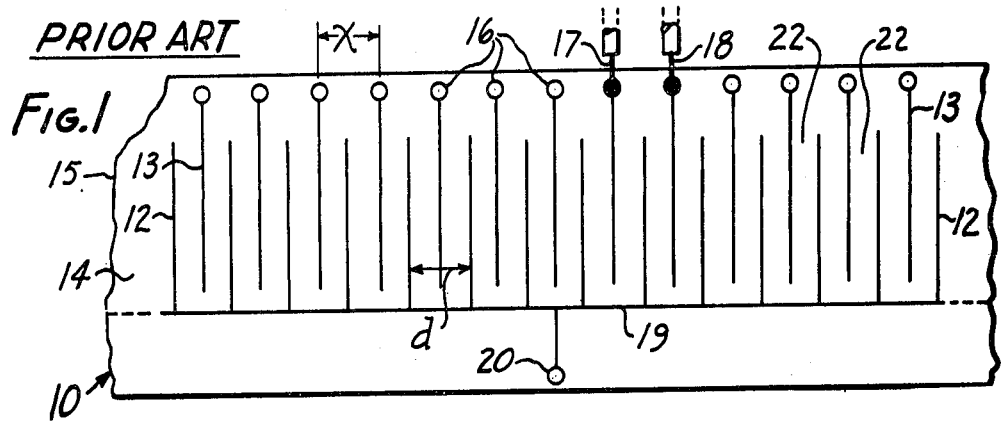
FIG. 1 is an elevation of a prior-art interdigitated electrode array structure.

The prior-art electrode array structure 10 shown in FIG. 1 has spaced parallel interdigitated first and second electrodes 12 and 13 alternating along an elongate region 14 of a substrate 15. Depending on the use of the electrode array structure, the substrate 15 may be merely a support for the electrodes or may be a chip or other structure on which a voltage or electric current supplied to the electrodes act. If desired, the substrate 15 may be supportive of a material on which a voltage or electric current supplied to the electrodes acts. For instance, the substrate may include or be supportive of a photoconductor material if the electrode array structure is to act as or in an optical scanner or some such apparatus. The substrate 15 may include or be supportive of a low Curie point material if the electrode array is to have a thermomagnetic or thermoremanent function. In the case of light arrays, the substrate 15 may consist or be supportive of an electrooptically active material, such as a PLTZ or other solid state compound. Other compositions of the substrate and other uses of the electrode array structures herein shown or disclosed are apparent within the confines of the state of the art in various fields of endeavor.

The formation or deposition of electrode structures on various substrates is a well-established art. Suffice to say, therefore, that the electrode structure may be deposited on the substrate 15 by evaporation, plating, painting or sputtering, and that preferred electrode materials include gold, indium, chromium and aluminum, depending on the use of the electrode structure.

The width or thickness of the individual electrode wires or strips also depends on the intended utility. For electrooptical applications an electrode thickness or width of 10 to 50 $\mu$m is typical. The spacing d between adjacent electrodes generally determines the resolution of the electrode array or the resolution attainable therewith. For instance, in an electrooptical device, the spacing between adjacent electrodes determines the number of light gates that can be provided per unit of linear measure, such as inch or centimeter. In this respect, the size of the electrode terminals 16 cannot arbitrarily be reduced even where a reduction of electrode thickness or width is possible. In electrooptical and other applications, where at least one of the electrodes in each pair such as each electrode 13, has to be individually driven or energized from its own distinct lead 17, 18 et seq. which has to be soldered, welded or otherwise fastened to the particular individual terminal 16, the requisite terminal size, rather than the attainable minimum electrode thickness or width is in fact the determinant of electrode spacing and thus of attainable electrode density and resulting resolution.

In many applications, a common electrode or lead 19 may be provided for jointly energizing one type of electrodes, such as the electrodes 12 as shown in FIG. 1. Such common electrode 19 may have its own terminal 20 which then serves as a common terminal for the electrodes 12.

Figure 2:
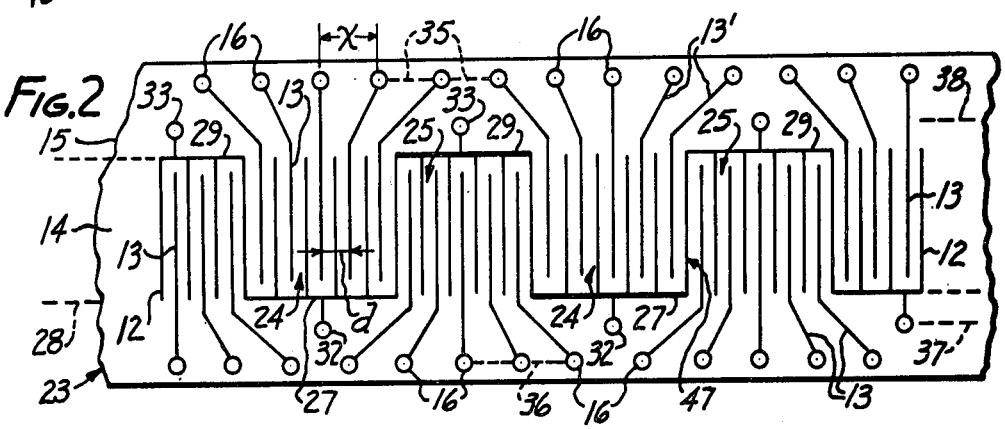
FIG. 2 is an elevation of an interdigitated electrode array structure useful in the practice of a preferred embodiment of the subject invention.

In FIG. 2, the spaced parallel interdigitated first and second electrodes 12 and 13 in the electrode array structure 23 are subdivided into first and second electrode arrays 24 and 25 alternating with each other along an elongate region 14 of the substrate 15. To render the electrode structure 23 practically effective, a plurality of first electrodes 12 and a plurality of second electrodes 13 are allocated to each of the two types of electrode arrays 24 and 25.

Each plurality of first electrodes 12 in each first electrode array 24 is provided with a first common electrode 27 located at a first side 28 of the elongate substrate region 14. Conversely, each plurality of first electrodes 12 in each second electrode array 25 is provided with a second common electrode 29 located at an opposite second side 31 of the elongate region 14. Terminals 32 and 33 are provided for the first and second common electrodes 27 and 29. As before, an individual terminal 16 is provided for each of the second electrodes thirteen. According to the illustrated preferred embodiments, any individual terminal 16 of any one second electrode 13 is spaced from any other individual terminal of any adjacent second electrode 13 by a center-to-center distance x greater than the center-to-center spacing d between that one second electrode 13 and the particular adjacent second electrode 13. It will thus be seen that, in structural terms, each first electrode array 24 has a plurality of first electrodes 12 and a plurality of second electrodes 13, with the first and second electrodes 12 and 13 of each first electrode array 24 being parallel to and spaced from each other, and interdigitated along part of the elongate region 14. Each first electrode array 24 further has a first common electrode 27 for the first electrode 12 in the particular first electrode array 24, with such first common electrode 27 being located at a first side 28 of the elongate region 14.

Each second electrode 13 in each first electrode array further having an individual terminal 16, with any individual terminal 16 of any one second electrode 13 being spaced from any other individual terminal 16 of any adjacent second electrode 13 by a center-to-center distance greater than the center-to-center spacing between that one second electrode 13 and the particular adjacent second electrode 13.

Similarly, each second electrode array 25, in structural terms, has a plurality of first electrodes 12 and a plurality of second electrodes 13, with the first and second electrodes of each second electrode array being parallel to and spaced from each other and being interdigitated along part of the elongate region 14.

Each second electrode array 25 further includes a second common electrode 29 for the first electrodes 12 in the particular second electrode array 25. That second common electrode in each second array 25 is located at a second side 31 of the elongate region 14. There again is an individual terminal 16 for each second electrode in each second array 25. In accordance with the illustrated preferred embodiments, any individual terminal 16 of any one second electrode is spaced from any other individual terminal of any adjacent second electrode by a center-to-center distance x greater than the center-to-center spacing d between that one second electrode and the particular adjacent second electrode.

The first and second common electrodes 27 and 29 have terminals 32 and 33.

In the illustrated preferred electrode array embodiments, the individual terminals 16 of the second electrodes 13 in each of the first electrode arrays 24 are arranged or located at the above mentioned second side 31 of the elongate region 14 of the substrate 15. Conversely, the individual terminals 16 of the second electrodes 13 in each of the second electrode arrays 25 are arranged or located at the first side 28 of the elongate region 14.

Figure 3:
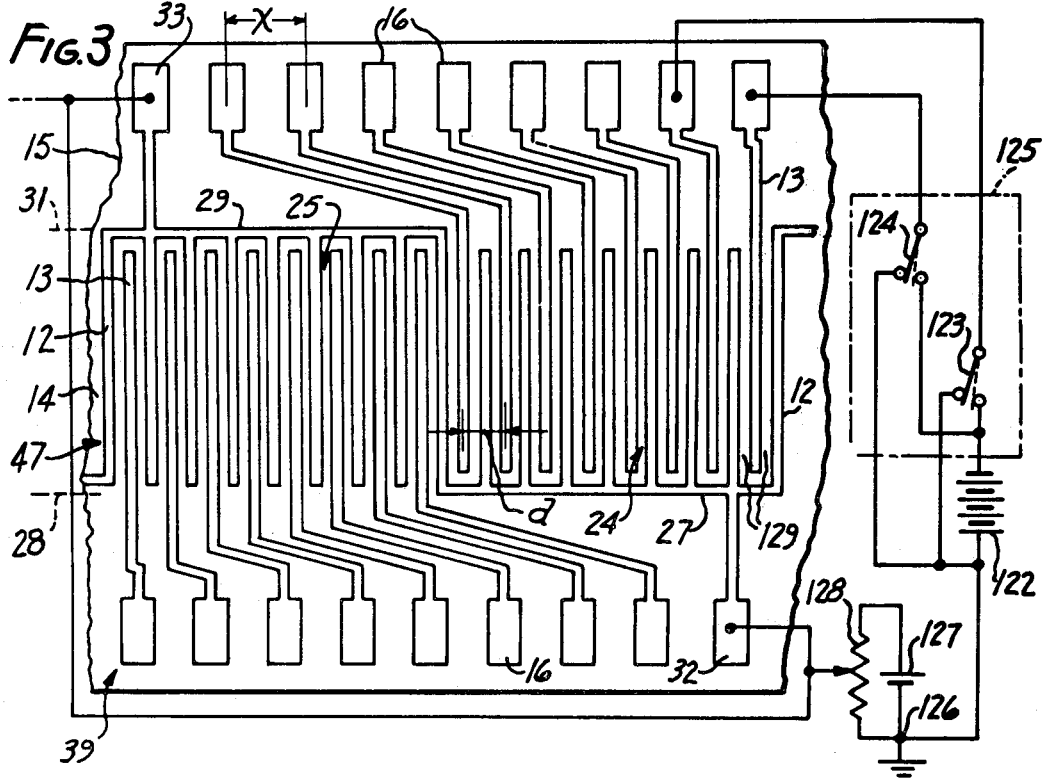
FIG. 3 is an elevation of an interdigitated electrode array structure, and a circuit diagram of electrode driver and gate actuation circuitry in accordance with a preferred embodiment of the subject invention.

In practice, this enables a convenient and advantageous attachment of driver or lead wires to the second electrodes 13 at both sides of the substrate 15. In the preferred embodiments shown in FIGS. 2 and 3, this also enables the individual terminals 16 to be spread out for increased spacing therebetween and/or increased density of the electrodes 12 and 13. As shown in FIGS. 2 and 3, slanted leads or electrode portions 13' may be employed to provide appropriate connections between the second electrodes and their individual terminals 16.

According to FIGS. 2 and 3, the individual terminals 16 of the second electrodes 13 in each of the first electrode arrays 24 are aligned along the second side 31 of the elongate substrate region 14. Conversely, the individual terminals 16 of the second electrodes 13 in each of the second electrode arrays 25 are aligned along the first side 28 of the elongate region 14.

At least in terms of efficiency and ease of connection, such an arrangement is presently preferred.

Further in accordance with a preferred embodiment of FIG. 2, not only the individual terminals 16 of the second electrode 13 in each of the second electrode arrays 25, but also the terminals 32 for the first common electrodes 27 are located at the first side 28 of the elongate region 14. In fact, in accordance with a further preferred embodiment, the individual terminals 16 of the second electrodes 13 in each of the first electrode arrays 24 and the second terminals 33 for the second common electrode 29 are arranged at the second side 31 of the elongate region 14.

Further in accordance with a preferred embodiment shown in FIG. 2, the individual terminals 16 of the second electrodes 13 in each of the first electrode arrays 24 are aligned along a first line 35 on the second side 31 of the elongate substrate region 14. Conversely, the individual terminal 16 of the second electrodes 13 in each of the second electrode arrays 25 are aligned along a second line 36 on the first side 28 of the elongate region 14.

Terminal means 32 for first common electrodes 27 are aligned along a third line 37 different from the first and second lines 35 and 36 and located on the first side 28 of the elongate region 14.

Further in accordance with a preferred embodiment, second terminals 33 for the second common electrodes 29 are aligned along a fourth line 38 different from the first, second and third lines 35, 36 and 37 and located on the second side 31 of the elongate region 14.

In practice, this permits maximum spacing between adjacent terminal pairs 16, 16; 32; and 16, 33. For a given minimum spacing between such electrode pairs, a maximum interdigitated electrode density is possible.

FIG. 3, on a somewhat enlarged scale, shows an electrode structure 39 which in many respects is similar to the electrode structure shown in FIG. 2. In addition, FIG. 3 shows an implementation of a further preferred embodiment, according to which the individual terminals 16 of the second electrodes 13 in the second electrode arrays 25 and terminal means 24 for the first common electrodes 27 are aligned along the first side 28 of the elongate region 14. Similarly, the individual terminals 16 of the second electrodes 13 in each of the first electrode arrays 24 and the second terminal means 33 for second common electrodes 29 are aligned along the second side 31 of the elongate region of the substrate. In terms of efficiency and ease of interconnection, this mutual alignment of individual and common electrodes 16/32 on the one side and 16/33 on the other side is presently most preferred. Also, the terminals 16, 32 and 33 in FIG. 3 are in the form of rectangular tabs or deposits, lending themselves to a rugged and reliable interconnection with the drive or energizing cables.

Figure 4:
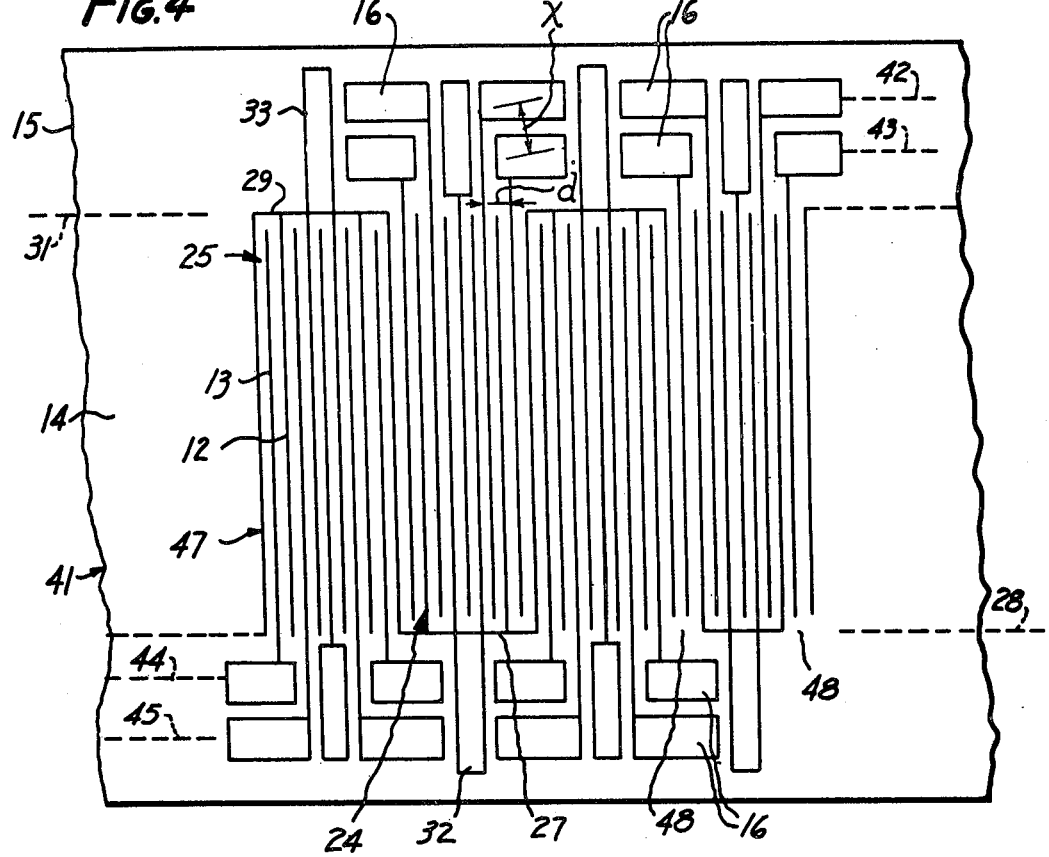
FIG. 4 is an elevation of a further interdigitated electrode array structure.

By way of contrast, a further electrode structure 41 is shown on an enlarged scale in FIG. 4.

According to FIG. 4, some or part of the individual terminals 16 of the second electrodes 13 in each of the first electrode arrays 24 are aligned along a first line 42 on the second side 31 of the elongate region 14 of the substrate 15. The remainder of the individual terminals 16 of the second electrodes 13 in each of the first electrode arrays 24 is aligned along a different second line 43 on that second side 31 of the elongate region 14.

Conversely, part of some of the individual terminals 16 of the second electrodes 13 in each of the second electrode array 25 are aligned along a third line 44 on the first side 28 of the elongate region 14, while the remainder of the individual terminals of the second electrodes 13 in each of the second electrode arrays 25 is aligned along a fourth line 45 different from the first, second and third lines 42, 43 and 44 and located on the first side 28 of the elongate region 14.

As before, any individual terminal 16 of any one second electrode 13 is spaced from any other individual terminal 16 of any adjacent second electrode by a center-to-center distance x greater than the center-to-center spacing d between that one second electrode 13 and the particular adjacent second electrode 13.

The embodiment of FIG. 4 enables a relatively compact terminal configuration with relatively large terminal surface areas. The principle of the illustrated preferred embodiments, of the defined distance x being greater than the corresponding defined spacing d may also be applied to the common electrode terminals 32 and 33 relative to adjacent individual terminals 16, as has already been indicated above. In particular, any of the first terminals 32 for first common electrodes 27 is preferably spaced from any adjacent individual terminal 16 of any one second electrode 13 by a center-to-center distance x greater than the center-to-center spacing d of any two second electrodes 13 being adjacent each other. Similarly, any of the second terminals 33 for second common electrodes 29 is preferably spaced from any adjacent individual terminal 16 of any one second electrode by a center-to-center distance x greater than the center-to-center spacing d of any two second electrodes 16 which are adjacent each other. This principle has been applied to the embodiment of FIGS. 2, 3 and 4.

In accordance with a further preferred embodiment, the first and second common electrodes 27 and 29 and adjacent first electrodes 13 include one common serpentine or squarewave common electrode 47, as is the case in FIGS. 2, 3 and 4. The provision of such serpentine electrode may have the advantage of obviating some of the common terminals 32 and 33.

However, if common terminals 32 and 33 can conveniently be provided on both sides 28 and 31 of the elongate substrate region 14 and can conveniently be associated with each common electrode 27 and 29, the serpentine common electrode 47 may be dispensed with, such as by providing breaks in the interconnections of corresponding common electrodes 27 and 29, such as shown at 48. In practice, such breaks may be desirable if a serpentine common electrode would display an objectionable induction in terms of switching speed or another parameter.

Depending on conductively or current carrying capacity requirements, the common electrodes 27 and 29 may be made wider or otherwise provided with a larger effective cross-section, such as shown in two instances in FIG. 2.

The electrode array structures herein shown may be employed in the electrooptical equipment herein disclosed, although their utility obviously is not so limited.

The solid state oscillograph apparatus 51 shown in FIGS. 5 and 6 has a base 52 and a lamp housing 53. A source of spatially concentrated light output, such as a short arc gas discharge lamp 54 is mounted in the lamp housing by means of sockets 55 and 56 and is electrically energized from a conventional electric power source 57. The showing of the lamp housing 53, socket mounts 55 and 56 and power source 57 has been omitted in FIG. 6 for increased clarity.

As best seen in FIG. 6, a first part 61 of the light output of the source of spatially concentrated light 54 is emitted to a first region 62 and is reflected at that first region 62 to a first portion 63 of an elongate second region 64. The means for emitting the first part of light 61 include a cylindrical belt lens 65 and a lamp reflector 66. Cylindrical belt lenses as such are known in the oscillography art and in effect consist of an elongate lens which is cylindrical in a direction transverse to its direction of elongation and which is curved in its direction of elongation. The lamp mirror 66 reflects light emitted by the lamp 54 and adds such reflected light to the first light part 61 emitted to the first region 62. Similarly, a second part 67 of the light output of the lamp 54 is emitted to a third region 68 by means of a belt lens 69 and a projector or lamp mirror 71.

The second light part 67 is reflected from the third region 68 to a second portion 72 of the elongate second region 64, such second portion 72 being spaced by a third portion 73 from the above mentioned first portion 63.

A third or central part 74 of the light output of the source 54 is emitted with the aid of a belt lens 75 to an elongate fourth region 76. Such emitted third light part 74 is reflected from the fourth region 76 to an elongate fifth region 77. Such reflected third light output part 74 is reflected from the fifth region 77 to the third portion 73 of the elongate second region 64 to provide a continuous band of light extending over the first, second and third portions 63, 72 and 73 of the elongate second region. As will become more fully apparent in the further course of this disclosure, the first, second and third light output parts 61, 67 and 74 are collimated. Also, it should be understood that the band of light which has been converted from the spatially concentrated light output of the point-type light source 54 extends continuously through the elongate second region 64 without break in continuity between the first and third portions 63 and 73 and second and third portions 72 and 73 of such second region 64, even though clarity of illustration may have dictated a type of showing of the light paths that may suggest a lateral discontinuity to the superficial observer.

This is not to say that the light uniformity has to be absolutely constant throughout the entire extent of the converted light band. Rather, the light intensity value may increase or decline somewhat within sensitivity tolerances of the oscillograph paper, reading photocell or other employed light recipient, whereby the converted band of light in effect has a practical uniformity subject to permissible tolerances.

In the illustrated preferred embodiment of FIGS. 5 and 6, the first and third regions 62 and 68 are arranged or extend symmetrically relative to the fourth or fifth region 76 or 77 or relative to the light source 54. This preferred arrangement maximizes efficiency, relative economy of means and uniformity of the resulting light band.

The means for emitting or reflecting the first light output part 61 include a curved mirror 78 providing a first curved reflecting surface 79 for reflecting the first part of the light output to the first portion 63 of the elongate second region 64.

Similarly, the means for emitting or reflecting the second light output part 67 include a curved mirror 81 located in the elongate third region 68 for reflecting the second light output part 67 to the second portion 72 of the elongate second region 64.

As seen in FIG. 6, the mirrors 78 and 81 or reflecting surfaces 79 and 82 are concavely curved.

According to the illustrated preferred embodiment shown in FIGS. 5 and 6, the first, second, third and fifth regions 62, 64, 68 and 77 are arranged or located in a common plane. The first part 61 of the light output of the lamp 54 is projected along the common plane from the first region 62 to the first portion 63 of the second region 64. Similarly, the second light output part 67 is projected along the common plane from the third region 68 to the second portion 72 of the elongate second region 64. The third light output part 74 is projected along the common plane to the third portion 73 of the elongate second region. As seen in FIG. 5, the third light output part 74 is in effect projected from the elongate fifth region 77 to the third portion 73 of the second region 64.

However, it also is to be noted that the third part 74 of the light source output is emitted or projected with the aid of a lamp reflector 83 along a folded light path 84 leading from the source 54 to the fourth region 76, hence by reflection to the fifth region 77 located closer to the source 54 than the fourth region 76, and thence by reflection to the third portion 73 of the elongate second region 64.

The method and apparatus for converting a spatially concentrated light output 74 into a band of light at the third portion 73 of the elongate second region 64 has utility not only in the context of the remainder of the light emission and reflection equipment shown in FIG. 6, but also is of independent utility in converting a spatially concentrated light output into a band of light, and will thus presently be discussed in greater detail.

In particular, the folded light path 84 is provided with the aid of a mirror 85 providing a reflecting surface 86 along the elongate region 76, and a mirror 87 providing a reflecting surface 88 along the elongate region 77.

At least one of the mirrors 85 and 87 or reflecting surfaces 86 and 88 is curved in the direction of elongation of the particular elongate region 76 and 77. In the preferred embodiment shown in FIG. 6, it is the mirror 85 or its reflecting surface 86 which is concavely curved in the direction of elongation of the elongate region 76.

In the folded light path 84 shown in FIGS. 5 and 6, the elongate fifth region 77 is laterally offset from a plane through the source 54 (i.e. through the center of the arc between the lamp electrode) and through a longitudinal dimension of the elongate fourth region 76. In terms of the above mentioned common plane, it may also be said that the elongate fourth region 76 and the belt lens 75 are laterally offset relative to that common plane.

Since many means for mounting lenses and mirrors are known and available or readily constructible, only some mounting means have been shown in FIG. 5 by way of example. For instance, the belt lenses 65 and 75 may be mounted on similar slanted brackets 89 attached to the base 52. Mounting brackets 91 and 92 have also been shown for the mirrors 85 and 87 in the folded light path 84. The lamp reflector mirrors 66, 71 and 83 may be mounted by brackets, one of which is shown at 91 in FIG. 5 as attached to the lamp housing 53.

In the illustrated preferred embodiment shown in FIGS. 5 and 6, the regions 76 and 77, being in effect the first and second regions of the folded light path 84, are arranged within the space between the source of light 54 and the third portion 73 of the elongate region 64.

Figure 7:
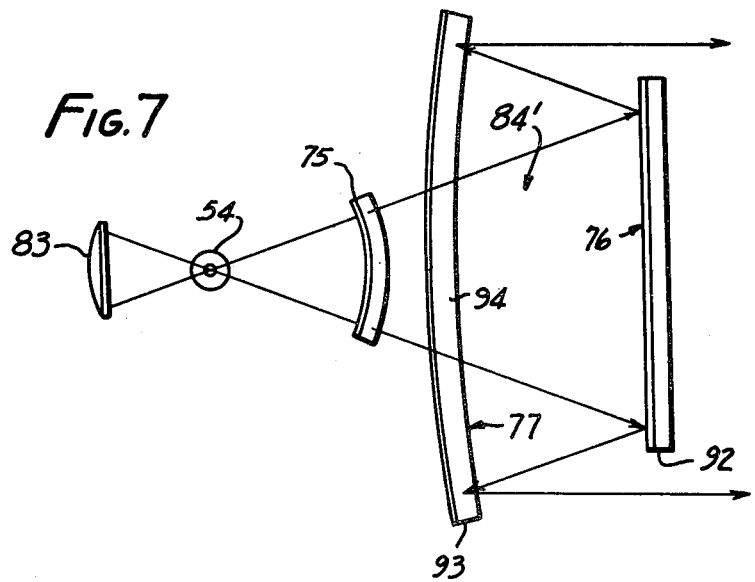
FIG. 7 is a top view of a first modification of the apparatus of FIGS. 5 and 6.

A modification of the folded light path 84 shown in FIGS. 5 and 6 is shown at 84' in FIG. 7, where an elongate planar or straight mirror 92 with a planar or straight reflecting surface extends along the elongate fourth region 76, while a concavely curved mirror 93 with a concavely curved reflecting surface 94 extends in the elongate fifth region 77. In that case, the longitudinal dimension of the mirror 92 in the fourth region 76 may be smaller than the longitudinal dimension of the mirror 93 in the fifth region 77. The embodiment shown in FIG. 7 may be used in the embodiment of FIGS. 5 and 6 by way of modification, or may be used independently.

By way of further modification of the embodiment shown in FIGS. 5 and 6, FIG. 8 shows a folded light path 84" in which one of the mirrors or reflecting surfaces is convexly curved. For present purposes, this is permissible when the overall or net curvature of the optical system of the folded light path is concave or at least acts in the nature of a concave system yielding parallel light output for the illumination of the light gate array.

Accordingly, an elongate convex mirror 95 with a convexly curved reflecting surface extends along the fourth region 76, while an elongate concave mirror 96 with a concavely curved reflecting surface 97 extends in the fifth region 77. The curvature of the concave mirror 96 is stronger than the curvature of the convex mirror 95 so that the overall curvature or effect of the folded light path system 84" is concave for a collimated orientation of the resulting light output. In the embodiments of FIGS. 5 to 8, and in other embodiments herein disclosed, the cylindrical belt lens collimates the light in a first direction and the associated mirror further collimates the light in a perpendicular second direction.

Figure 9:
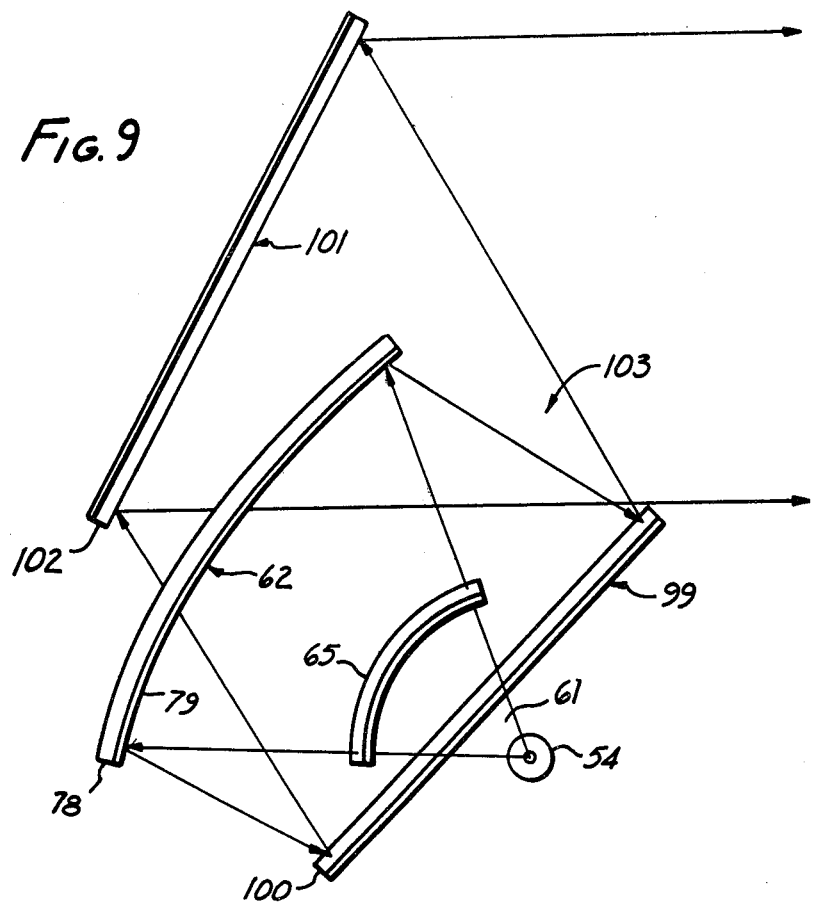
FIG. 9 is a top view of a third modification of the apparatus shown in FIGS. 5 and 6.
Figure 10:
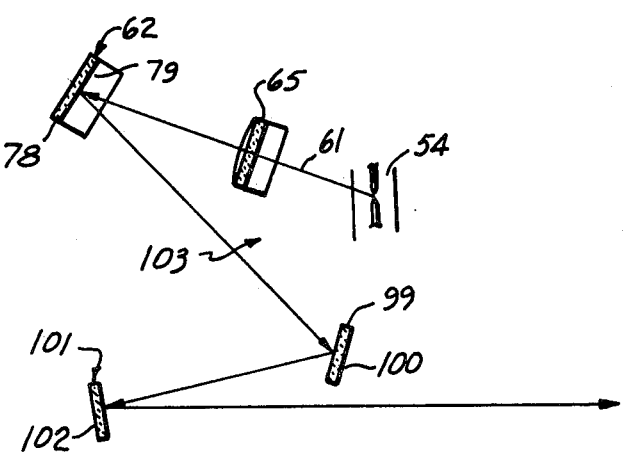
FIG. 10 is a side view of the modification shown in FIG. 9.

By way of further modification, FIGS. 9 and 10 show a top and side view of a folded light path system which may be employed in the embodiment of FIGS. 5 and 6 in substitution or modification of the lateral light band producing means.

Of course, the system illustrated in FIGS. 9 and 10 has utility apart from the system of FIGS. 5 and 6 also.

The first part 61 of the light output of the source 54 is in FIGS. 9 and 10 again emitted via belt lens 65 in the form of a divergent sheet of light to a curved mirror 78 presenting a concave reflecting surface 79 in the elongate region 62. The surface 79 reflects the light to an elongate region 99 occupied by a mirror 100. The mirror 100 reflects the light to a further elongate region 101 occupied by a mirror 102 which further reflects the light to the first portion 63 of the elongate second region 64, for instance.

It is thus seen that the folded light path 103 in the embodiment of FIGS. 9 and 10 leads from a source 54 of spatially concentrated light to a spaced elongate region 62 hence by reflection by the reflecting surface 79 of the mirror 78 to an elongate region 99, thence by reflection by the mirror 100 to the elongate region 101 and thence by reflection by the mirror 102 to a further elongate region, such as the portion 63 of the second region 64 shown in FIG. 6.

At least one of the mirrors or reflecting surfaces in the folded light path 103 is curved in the direction of elongation of the particular elongate region it occupies. In the embodiment shown in FIGS. 9 and 10, it is the mirror 78 which is concavely curved. However, such as with reference to FIG. 7, another of the mirrors shown in FIGS. 9 and 10 may be curved.

Also, with reference to FIG. 8, one of the mirrors in the folded light path 103 of FIGS. 9 and 10 may be convexly curved, as long as the overall curvature or net effect of the light path is concave to provide the desired parallelism in or combination of the light output. With further reference to the embodiment shown in FIGS. 9 and 10, it will be noted that the second-in-line region 99 is situated closer to the light source 54 than the first region 62. Also, the third-in line region 101 is situated farther from the light source 54 than the second-in-line region 99.

The second-in-line region 99 is laterally offset from a plane through the source 54 of spatially concentrated light and a longitudinal dimension of the elongate first region 62. The same applies to the third-in-line region 101 which, moreover, is laterally offset from a plane through longitudinal dimensions of the elongate regions 62 and 99, to provide the folded light path 103 as shown in FIGS. 9 and 10.

The illustrated preferred embodiments of FIGS. 5 to 10 are ideally suited to provide light outputs requisite for the recording of varying electric signals. In this respect, it should be understood that the recording of electric signals need not be an end in itself. For instance, the information to be recorded need not originally be contained in an electric signal. Rather, information or a varying parameter may be transduced to a varying electric signal which is employed to drive a galvanometer or light modulator or gate.

In fact, the illumination systems herein disclosed are ideally suited for illuminating PLZT or other solid state light gates because of the high intensity realizable with spatially concentrated or point-type light sources and the high collimation or parallelism and light intensity uniformity realizable with the disclosed optical systems despite the concentrated or point-type origin of the light output.

If a given light gate array is relatively wide, the requisite illumination is preferably generated in several parallel stages or parts, such as the light output parts 61, 67 and 74 shown in FIG. 6 and jointly illuminating the elongate region 64 via its contiguous portions 63, 72 and 73. On the other hand, shorter light gate arrays may be illuminated in only one stage, such as only the center portion or folded light path 84 shown in FIGS. 5 and 6 or the folded light path 103 shown in FIGS. 9 and 10.

An elongate light gate assembly 105 is shown in FIGS. 5 and 6 located on the baseplate 52 for illumination by the continuous light band provided along the second elongate region 64. The assembly 105 has a light gate structure 106 contained in a mount 107 positioned on the base 52.

The plate-like elongate structure 106 includes the PLZT or other employed electrooptically active solid state material, if necessary on a transparent supporting substrate.

Lead wires or cables 108 and 109 are connected to electrode arrays located on the PLZT or other solid state material.

In accordance with a preferred embodiment of the subject invention, one of the interdigitated electrode arrays shown in FIGS. 2 to 4 is employed in the light gate structure 106 to provide a multitude of high-density light gates along the assembly 105 for optimum resolution.

The light gate assembly also includes the traditional crossed light polarizer plates comprising a polarizer 110 and analyzer 111 between which the solid state light gate structure 106 is positioned. According to FIG. 5, the assembly 105 also includes two elongate cylinder lenses 112 and 113 mounted in tandem in the mount 107 to provide a recording lens system having a short focal lens and low aberrations. In this respect, it may be noted in practice that the tilt of the mirrors, such as the mirror 85, should advantageously be different between the centers and the ends, since the vertical angles of reflection are slightly different as between the axial and the marginal rays. Accordingly, the mirrors may be slightly twisted, such as by mounting metal mirrors rigidly at their centers while applying torsion at the ends. An angularly adjustable mirror mounting member for applying a controlled torsion to the mirror 85 is indicated at 114 in FIG. 5.

In practice, a bracket 160 may engage a central portion of the mirror 85 midway between its outer ends at the mounting brackets 91. The bracket 160 may project from a bar 164 connected to and extending between the mounting brackets 91. In this manner, the central portion of the mirror 85 may be held stationary against the torsion applied by the angularly adjustable mirror mounting members 114 at opposite ends of the mirror.

The recording lens system comprising the cylinder lenses 112 and 113 projects light gated by the structure 106 with crossed polarizers 110 and 111 as a spot 115 onto a light-sensitive paper or other recording medium 116 which is advanced relative to the light gate assembly 105 via a drum 117 driven by a motor 118, as shown in FIG. 6.

There are several techniques by means of which the band of light provided by the optical system may be modulated to provide, along the light band, light outputs varying as a function of the varying electric signals or other input parameters, whereby the varying light outputs may be recorded on the medium 116. For instance, different elemental portions of the light band at the elongate second region 64 may be selectively gated to provide a light spot 115 shifting as a function of the varying electric signals or parameters, whereby such shifting light spot may be recorded on the traveling medium 116 as an oscillograph trace 120. Of course, light within a given elemental area will not travel as such to other elemental areas. Rather, the successive gating or different elemental areas in effect will give the impression of a traveling light spot manifesting itself in the recorded oscillograph trace 120.

The light gate assembly 105 subjects light from the band of light at the elongate region 64 to light-blocking crossed polarization by means of the polarizer and analyzer 110 and 111, and the gated solid state element 106 selectively overcomes the light-blocking property of the crossed polarization to provide the requisite varying light outputs or light spot 115 shifting as a function of the varying input signals and resulting in the oscillograph trace 120 either directly or after photographic or other development, depending on the nature of the recording medium 116. In this respect, any of the preferred embodiments illustrated in FIGS. 5 to 10 or of subsequently discussed embodiments may be employed for this purpose. Various means exist for gating or driving the light gate of the assembly 105. As shown in FIG. 3, gating current of the requisite voltage may be provided by an electric power source 122 which is selectively connected to individual electrodes 13 via individually controlled switches 123 and 124 in a control 125.

Of course, the control 125 typically has an individual switch for each light gate. Also typically, these switches modernly would be of an electronic nature. By way of example, the gating switches may form part of an electronic encoder which renders the varying signals to be recorded suitable for driving the light gates.

In their solidly illustrated rest position, the switches 123, 124, etc. in the control 125 maintain the individual gate electrodes 13 connected to ground or earth 126. In its actuated condition, indicated by a dotted line, each switch in the control 125 connects its associated individual gate electrode 113 to the driver source 122 for an opening of the particular light gate.

Inductive, capacitive and other phenomena affecting PLZT and other solid state light gates tend to put limitations on attainable switching speeds thereby impeding the progress of solid state oscillograph, facsimile and other equipment.

In accordance with a further aspect of the subject invention, it has been found that this impediment can be ameliorated by a predetermined preconditioning of the light gates to subsequent opening in response to driving signals.

In terms of the preferred embodiment shown in FIG. 3, the light gates between interdigitated first and second electrodes 12 and 13 are electrically biased to an initially open condition. To this end, a source of electric bias potential 127 is provided between ground and the common electrodes 27 and 29. A variable potentiometer 128 is connected to the source 127 for an adjustment of the bias potential.

In the rest position of the switches 123 and 124, an electric bias circuit extends from the source 127 through the potentiometer 128 and its movable contact to the common terminals 32 and 33 and hence through first electrodes 12, adjacent light gates, second electrodes 13, individual terminals 16, and further in parallel through switches 123 and 124 in their solidly illustrated rest position illustrated by solid lines, and thence to ground 126 and the grounded side of the source 127.

In this manner, the light gates between the interdigitated electrodes 12 and 13 are biased to an initially open condition. The extent of this open condition is adjusted by adjustment of the potentiometer 128.

Such adjustment, in turn, is attuned to the sensitivity of the recording medium or paper 126.

In particular, the light-sensitive recording medium 116 typically has a certain threshold value of sensitivity. For instance, in the case of direct print recording paper, there is an intensity inertia or reciprocity failure which permits a certain light leakage without a display of undesirable background fog.

In general terms, the light gates of the assembly 105 are illuminated with light of a first intensity above zero light intensity. The light sensitive recording medium 116 is sensitive to illumination levels at light intensities including the mentioned first light intensity and starting at a second light intensity below that first intensity and above zero light intensity. The source 127 is dimensioned and the potentiometer 128 adjusted to provide a first voltage for biasing the light gates to an initially open condition wherein the gates pass light from the mentioned first-intensity illumination at an intensity above zero light intensity, but below the mentioned second light intensity at which the recording medium would be fogged.

Accordingly, the bias source 127 and potentiometer 128 constitute means for exposing the recording medium 116 to the light passed by the preconditioned gates in their initially open condition whereby the recording medium is exposed to light below the mentioned second intensity.

The preconditioned light gates 129 are thereupon selectively energized and further opened in response to the varying signals to be recorded by selective energization of the switches 123, 124, etc. in the control 125, so as to pass light from the above mentioned first intensity illumination at at least the second light intensity at which the recording medium 116 is sensitive and will provide a recording of the luminous representation of the varying input signal.

In order to open the light gates 129 selectively, the electric sources 122 and 127 may be operated in series as shown in FIG. 3. In this manner, it is possible to operate with a source 122 having only a voltage that would not by itself satisfactorily open the light gates in response to the input signal to be recorded. In particular, the gate driver source 122 may have a second voltage only capable by itself of opening the light gates to pass light from the above mentioned first-level illumination at a level below the second light intensity at which the recording medium is sufficiently sensitive. In practice, this statement may have to be interpreted within an appropriate time frame relating to the employed solid state light gate material. For instance, it may be that the mentioned second voltage would eventually be capable of opening the light gates sufficiently, but would not be so capable within a given time period required for a desired rapid response.

This frequently occurring situation is intended to be encompassed within the satement of "a second voltage only capable by itself of opening the light gates to pass light from the mentioned first-intensity illumination at a level below the mentioned second light intensity".

If voltage provided by the bias source 127 and adjusted potentiometer 128 is called a first voltage, then the second voltage provided by the gate driver 122 is capable in combination with the electric bias having the mentioned first voltage of opening the light gates to pass light from the above mentioned first-intensity illumination at at least the mentioned second light intensity at which an oscillograph trace 120 or a facsimile signal will be recorded.

By way of further modification of the embodiment shown in FIGS. 5 and 6, FIG. 11 shows a system in which light is emitted from the source 54 through the region 77 to the first region 76, hence by reflection to the second region 77, and thence by reflection to the region 64 at its portion 73.

In the illustrated preferred embodiment shown in FIG. 11 the region 77 is occupied by a transparent plate 131 mounted on the base 55 and having a coating of a partially transparent, reflective film 132. The elongate region 76 is occupied by a plate 133 mounted on the base 52 at a distance from the plate 77 and having a partially transparent reflective film.

The plate 132 is closer to the light source 54 than plate 134.

Also, at least one of the plates 132 and 134 is curved in the direction of elongation of the particular region 77 or 76 for collimating emitted light into a band of light. According to FIG. 11, the plate 133 is curved concavely as seen from the point of view of the coating 134. The principles illustrated in FIGS. 7 and 8 may be employed to curve either one or both of the plates 131 and 133. Plates with partially transparent, reflective films delimiting an air space therebetween are known from the Fabry-Perot interferometer. (see C. Fabry and A. Perot, Ann. Chim. Phys. (7), 16 (1899), 115, or Max Born, PRINCIPLES OF OPTICS (3rd Ed), Pergamon Press, 1965, 7.6.2, pp. 329 et seq.)

It is an advantage of the embodiment shown in FIG. 11 that the third part of light 74 from the source 54 can be projected in the common plane in which the first and second parts 61 and 67 are projected. Of course, the embodiment of FIG. 11 has utility independently of the embodiment of FIG. 6, and it may generally be said that the embodiment of FIG. 11 processes light from the source 54 in planes parallel to the base 52.

In particular, light is emitted from the source 54 with the aid of the belt lens 75 through the transparent plate 131 and partially transparent film 132 to impinge on the partially transparent reflective film 134.

That film 134 reflects part of the light back to the film 132 which, in turn, reflects part of the light back to the film 134 for transmission through that partially transparent film and the transparent plate 133 to the light gate assembly which is thus illuminated by a band of light extending in the region 64 or its portion 73. Light from that band is gated onto the recording medium 116 and recorded as an oscillograph trace in the manner mentioned above in connection with FIGS. 5 and 6.

While the embodiment shown in FIG. 11 has advantages of its own, the folded light path embodiments herein disclosed are preferred for their improved collimation or parallelism of the light output.

In the embodiments shown in FIGS. 12 to 17, as well as in the above mentioned embodiments divergent light from a spatially concentrated source 54 is emitted into a sheet of light having an elongate cross-section of sufficient width in its direction of elongation to illuminate the elongate light gate array in the assembly 105 upon collimation. In particular, light is emitted from the source 54 via belt lens 65 to the reflective surface 136 of a mirror 137 extending in an elongate region 138. The first part of light 61 is reflected by the mirror 137 onto a first Fresnel lens 139 which collimates the first light part and projects it onto a first portion 141 of the elongate region 64.

Similarly, the second light part 67 is projected from the source 54 by a belt lens 69 onto the reflective surface 142 of a mirror 143 extending in a region 144. The mirror 134 reflects the second light part 67 onto a second Fresnel lens 145 which, in turn, projects the received second light part to a second region 146 of the elongate region 64. In this manner, the light gate assembly 105 is illuminated with a continuous band of light extending throughout the region 64. As before, the gate assembly 105 selectively gates the light from the uniform band in accordance with a varying input signal, so as to provide an oscillograph trace 120 or other desired record of the input signal. In this respect, the light gates in the assembly 105 are selectively opened by selective electrical actuation for a controlled transmission of the collimated light through the recording medium 116.

Figure 14:
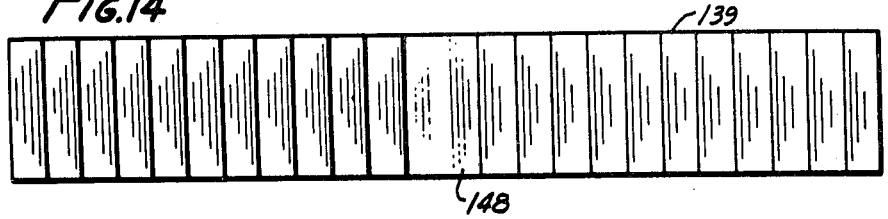
FIG. 14 is an elevation of a component of the apparatus shown in FIGS. 12 and 13.
Figure 15:
FIG. 15 is a top view of the component shown in FIG. 14.
Figure 12:
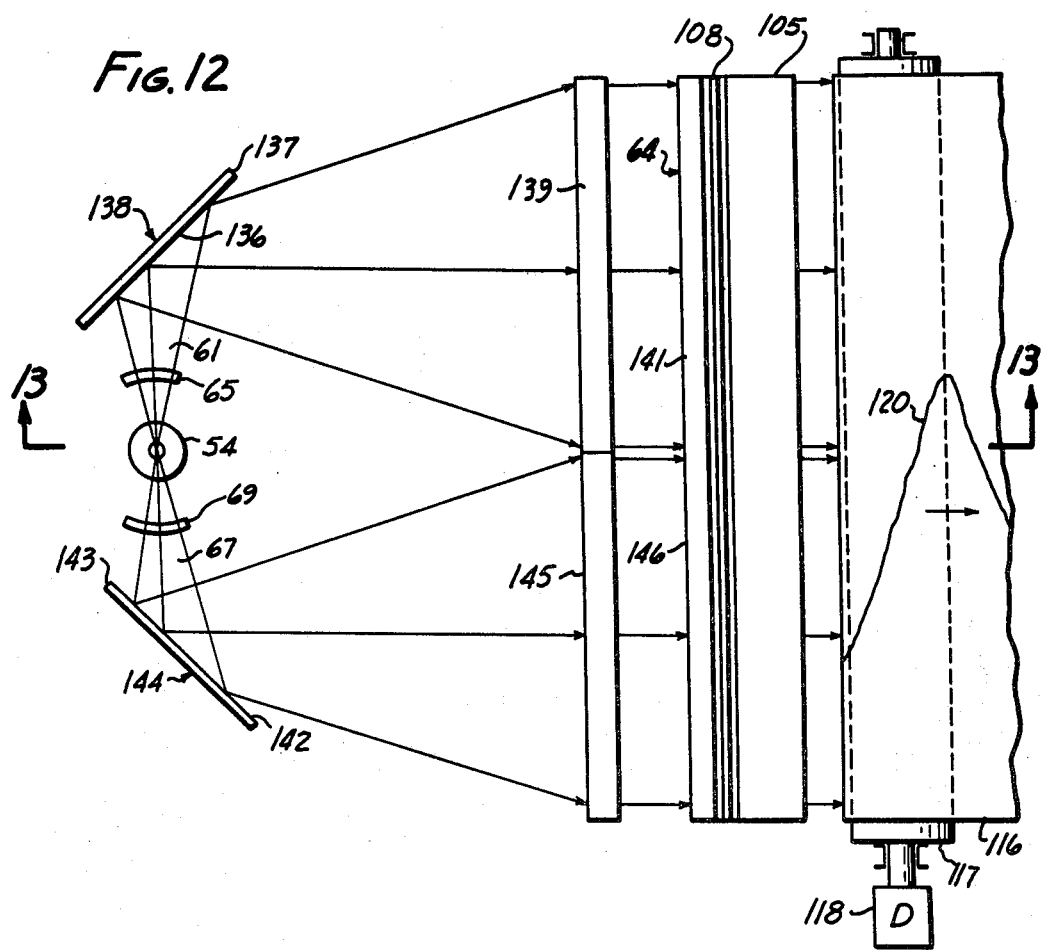
FIG. 12 is a top view of a solid state oscillograph apparatus which may incorporate a preferred embodiment of the subject invention.
Figure 13:
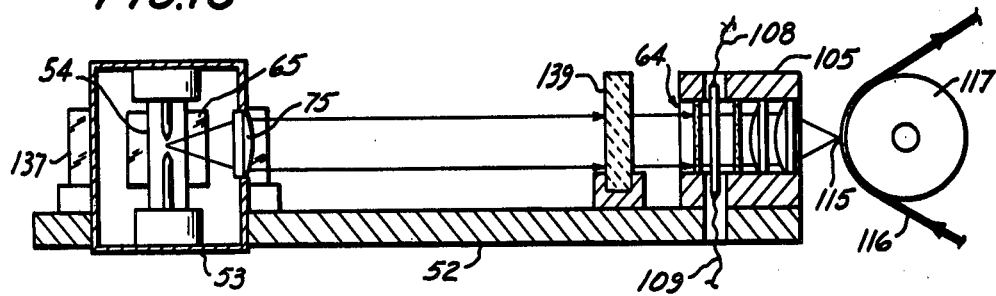
FIG. 13 is a section taken along the line 13-13 in FIG. 12.

By way of example, FIGS. 14 and 15 show an elevation and a top view of a Fresnel lens, on an enlarged scale, for use in the apparatus of FIGS. 12 and 13 and 20 and 21. The Fresnel lens in FIGS. 14 and 15 is labeled with the reference numeral 139, but it should be understood that the same Fresnel lens can be used at 145 in the apparatus of FIGS. 12 and 13.

The Fresnel lens of FIGS. 14 and 15 preferably is of the Fresnel cylinder lens type which is composed of symmetrical transparent prisms having trapezoidal profiles as shown in FIGS. 14 and 15.

In particular, the Fesnel lens 139 has a central cylindrical surface 148 followed by saw tooth-like surfaces increasing in height in opposite directions from the central surface 148. In practice, saw tooth profiles may provide sufficient approximations. However, the top surfaces of the saw tooth configurations may be shaped cylindrically for increased collimation or parallelism of the light output.

Depending on the width of the light gate assembly 105, a single Fresnel lens 139 may be employed for collimating the light into the requisite band.

Figure 16:
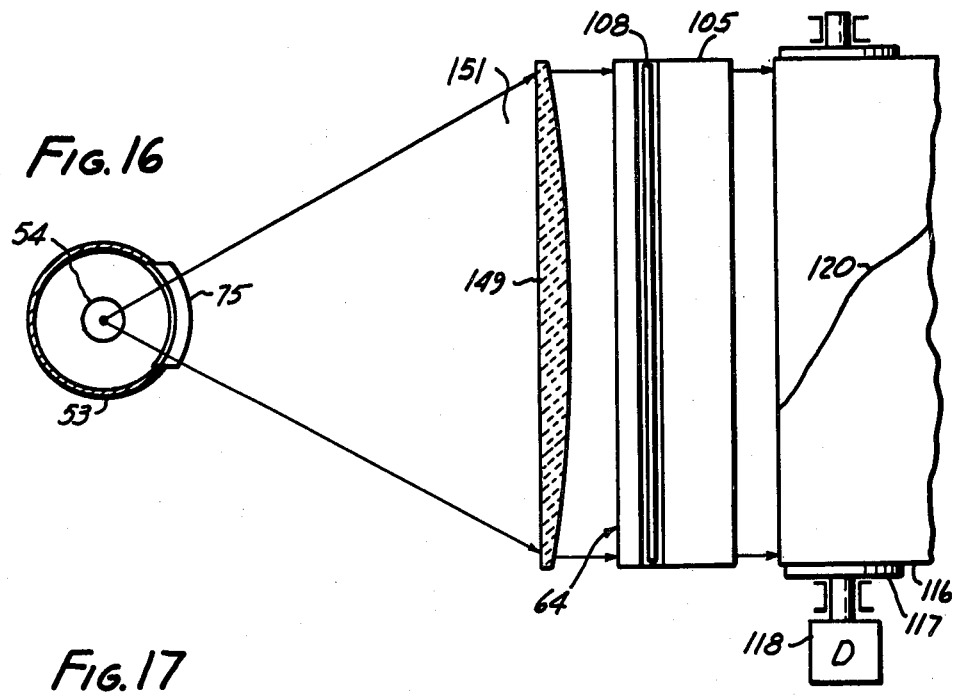
FIG. 16 is a top view of a solid state oscillograph apparatus which may incorporate a preferred embodiment of the subject invention.
Figure 17:
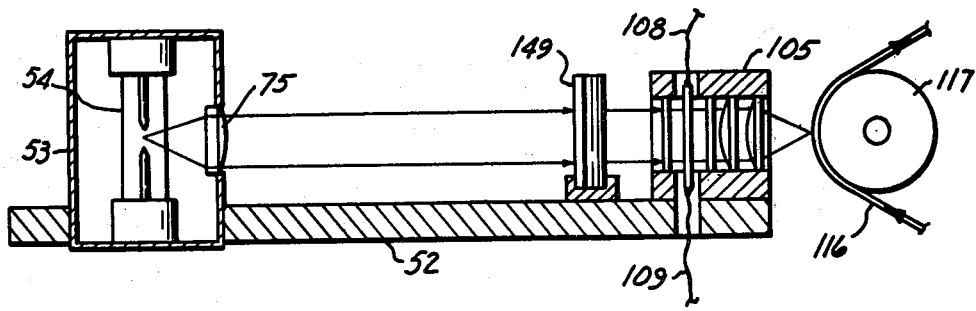
FIG. 17 is a side view, partially in section, of the apparatus shown in FIG. 16.

An embodiment of this type is shown in FIGS. 16 and 17, except that, by way of further modification, a large cylinder lens 149 is employed for collimating divergent light from the light sheet 151 into a band of collimated light in the elongate region 64. Again, the light gate assembly 105 is electrically operated to provide an oscillograph trace 120 or other desired record of the input signal.

Among the light band forming embodiments so far discussed, the embodiment of FIGS. 5 and 6 is presently considered to constitute the best mode.

The light band forming principles and equipment herein disclosed may in accordance with a further preferred embodiment be employed for operating facsimile apparatus in the writing and/or reading mode.

In that case, the switches 123, 124, etc. in the control 125 are operated in a manner known per se to open the light gate 129 sequentially and in synchronism with reading circuits 152 as indicated by the line 153 shown in FIG. 18.

By way of example, FIGS. 18 and 19 illustrate a method and show apparatus for reading information 154 from a document 155 advancing via a drum 117 driven by a motor 118. The information 154 is perceptible upon illumination gated by the assembly 105.

The band of light with which the light gate assembly 105 is illuminated along an elongate region 64 may be provided by any of the methods and apparatus shown in FIGS. 5 to 17, with the embodiment of FIGS. 5 and 6 being presently preferred for larger document width.

In the operation of the reader shown in FIGS. 18 and 19, the multitude of gates 129 (see FIG. 3) effectively subdivides the band of light along the region 64 into elemental portions. Sequential energization of the second electrodes 113 by the control 125 successively gates the elemental light portion to the information 154 for successively illuminating elemental areas of that information or of the document 155 along a transverse line.

This scanning cycle is repeated as needed for scanning the entire advancing document 155.

The successively or sequentially illuminated information areas are read with the aid of an elongate photocell 157. If desired, a smaller photocell looking at the document 155 through a lens (not shown) may be employed.

As indicated at 158 in FIG. 19, light is reflected from sequentially illuminated document areas into the photocell 157. The photocell is connected through a resistor 159 and amplifier 161 with variable gain as indicated at 162 to reading circuits 152 which may be of a conventional type, and which are synchronized with the light gate control 125 so that the reading circuits are at all times informed what particular spot the photocell is reading at the moment.

The above mentioned advantages connected with the use of the bias source 127 and adjustable potentiometer 128 or, in general terms, the above mentioned light gate preconditioning may also be employed advantageously in the reader of FIGS. 18 and 19.

In particular, any of the preferred embodiments shown in FIGS. 5 to 17 may be employed to illuminate the gate array 105 along an elongate region 64 with light of a first intensity above zero light intensity.

The bias source 127 and potentiometer 129 may be employed as shown in FIG. 3 for preconditioning the light gates in the plurality of electrically controlled light gates 129 in the assembly 105 to subsequent opening in response to electric control signals actuating the switches 123, 124 etc. in the control 125 shown in FIG. 3.

As before, the preconditioning may be done by the source 127 and potentiometer 128 electrically biasing the light gates 125 the an initially open condition wherein the gates 129 pass light from the illumination band at the elongate region 65 at an intensity above zero light intensity and below a second intensity lower than the first intensity of the light band.

The sequentially gated assembly 105 subjects the record 155 with information 156 to a first illumination of an intensity above zero light intensity and below the mentioned second intensity as passed by the preconditioned gates in their biased, initially open condition. The control 125 with sequentially actuated switches 123, 124 etc. and the controlled gate assembly 105 further subject the record 155 to a second illumination by opening the preconditioned light gates in response to electric control signals which cause passage of light through the assembly 105 at at least the second light intensity and scanning of the record 155 with the passed light at at least the mentioned second intensity.

The reading equipment, including the photocell 157, is conditioned for reading information from the record 155 only in response to the mentioned second illumination. To this end, means may be provided for inhibiting a response by the reader to the mentioned first illumination provided by the preconditioned gates. In particular, the photocell 157 may have an inherent threshold of response which renders it relatively insensitive to the mentioned first illumination.

Alternatively, a clipping amplifier 161 or an amplifier 161 with a high direct-current threshold such that a signal below a minimum level would produce no output may be employed to render the reading circuits 152 insensitive to the mentioned first illumination caused by the biased, preconditioned gates. The photocell 157 with inherent threshold or the clipping amplifier 161 or amplifier with high direct-current threshold constitute means for inhibiting a response by the reading equipment to the mentioned first illumination.

However, it should be understood that the scope of the subject invention also extends to apparatus and methods wherein the bias source 127 and potentiometer 128 shown in FIG. 3 are omitted and the common electrodes 32 and 33 are connected directly to ground 126. In that case, the gates 129 would not be preconditioned and the voltage of the source 122 may have to be augmented to open the gates sufficiently by itself. A normal (e.g. non-clipping) type of amplifier 161 could then be used in FIG. 18.

The embodiment of FIGS. 20 and 21 provides the solid state light gate structure 106 with crossed polarizer 110 and analyzer 110 between two collimating structures 166 and 167.

The collimating structures 166 and 167 may be large cylinder lenses or preferably cylinder Fresnel lenses of the type shown in FIGS. 14 and 15.

Accordingly, the apparatus shown in FIGS. 20 and 21 preferably has first and second Fresnel cylinder lenses 166 and 167 mounted relative to the base 52.

The light gate structure 106 with crossed polarizer and analyzer 110 and 111 is mounted between the spaced collimating lenses 166 and 167. Divergent light from the source 54 and sheet 151 is collimated with the first lenses 166 and is projected as a band of collimated light through the polarizer 110 to the light gate array 106 to be gated in response to a variable input signal via the control 25 shown in FIG. 3. The gated light passes the analyzer 111 and is converged by the second Fresnel lens 167. In other words, light from the controlled transmission effected by the light gate assembly is converged with the second Fresnel lens 167.

The converged light is imaged onto a surface by means of a lens system 169. Viewed differently, the second Fresnel lens 167 and the lens system 169 jointly image the collimated light from the controlled transmission provided by the light gate array onto a surface. The particular surface may be a surface of a photographic material or other recording medium 171 which is driven by a motor 118 on a drum 117. In this manner, the imaged light transmissions may be recorded. In particular, the light transmissions provided by the polarized gate array may be imaged and recorded as a scale which, as shown at 172 in FIG. 20 is reduced relative to the extent of the light gate array 106.

In the imaging lens system 169 an objective lens of the general type used in microfilm cameras may be employed, with the Fresnel lens 167 serving as a field lens to ensure that the light from the gate array is redirected to pass through the lens system 169. The image formed by the objective lens would ordinarily be a reproduction of the light gate array in both the vertical and horizontal dimensions. Preferably, a negative cylinder lens 173 is placed near the objective lens so that light gated at 106 is imaged on the film 171 along a line. The power of the negative cylinder lens 173 is such that the image of the height of the arc in the lamp 54, otherwise to be found in the transform plane of the objective lens is imaged onto the film 171.

The embodiment shown in FIGS. 20 and 21 is particularly advantageous for use in Computer Output Microfilm (COM) Apparatus. If desired, the general principles shown in FIGS. 20 and 21 may be employed to enlarge the image of the light gate array. In either case, alphanumeric characters may be recorded or displayed by suitable control of the light gate array 106 in a manner known in the control of alphanumeric oscillograph displays.

Figure 22:
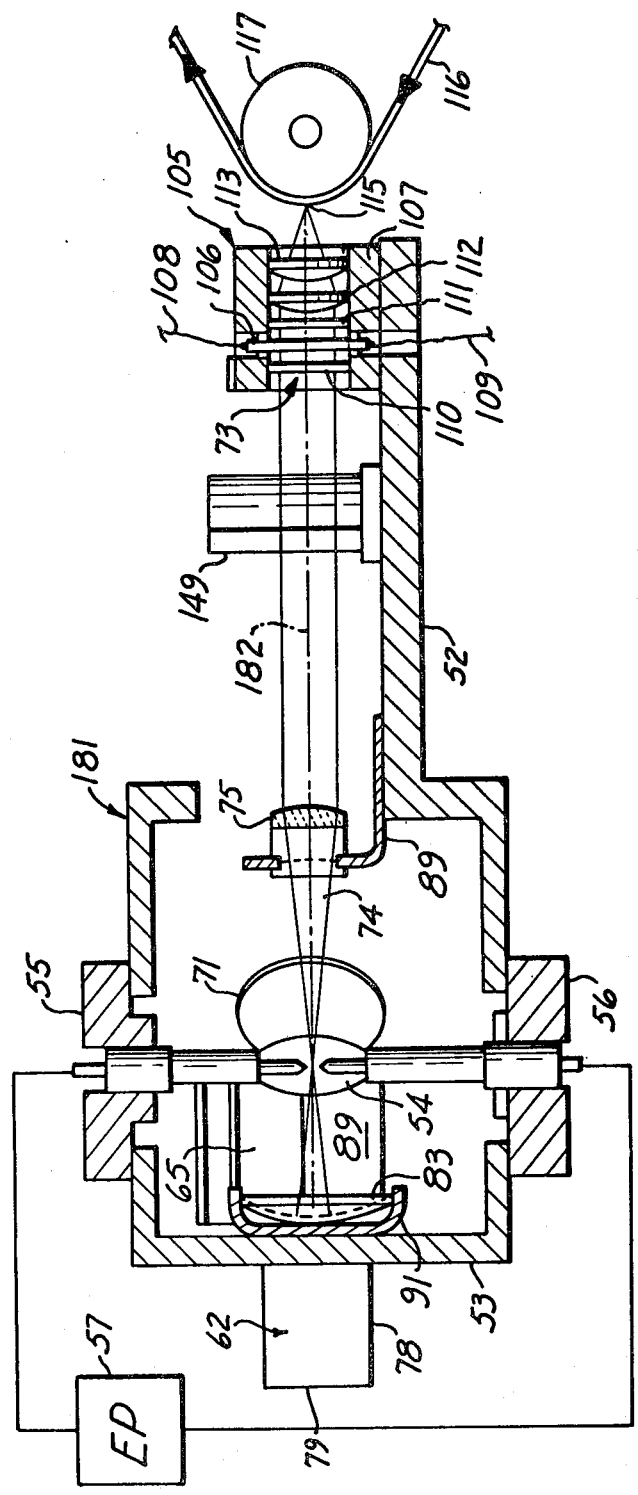
FIG. 22 is a section, taken along the line 22-22 in FIG. 23, of a solid state oscillograph apparatus which may incorporate a further preferred embodiment of the subject invention.

The solid state oscillograph apparatus 181 shown in FIGS. 22 and 23 to a large extent resembles the apparatus according to FIGS. 5 and 6 as modified according to the teachings of FIGS. 16 and 17. Accordingly, like reference numerals are employed to designate like or functionally equivalent parts as among FIGS. 5, 6, 16, 17, 22 and 23, and reference should be had to the above description of FIGS. 5, 6, 16 and 17, as far as the purpose, nature and function of corresponding parts in FIGS. 22 and 23 are concerned.

On the other hand, some differences between the presently most preferred embodiment of FIGS. 22 and 23 on the one hand, and the embodiments of FIGS. 5 and 6 on the other hand, will presently be disclosed.

In particular, the folded light path 84 of the apparatus of FIGS. 5 and 6 has been replaced in the equipment of FIGS. 22 and 23 by a lens device, such as the cylinder lens 149 shown, and mentioned above in connection with, FIGS. 16 and 17.

If desired, the lens means 149 may be composed of two or more lens elements for less aberration and better performance.

Also, in the apparatus of FIGS. 22 and 23, the first, second and third regions 62, 64 and 68 are arranged or located in a common plane 182.

As before, the first part 61 of the light output of the lamp 54 is projected along the common plane 182 from the first region 62 to the first portion 63 of the second region 64. Similarly, the second light output part 67 is projected along the common plane 182 from the third region 68 to the second portion 72 of the elongate second region 64.

In the embodiment of FIGS. 22 and 23, the third light output part 74 is projected along the common plane to the third portion 73 of the elongated second region 64 via lenses 75 and 149 directly in a straight path, rather than in any folded light path. The mirror 83 and lenses 75 and 149 constitute an assembly for optically projecting the third part 174 of the light output of the source 54 to the third portion 73 of the elongate region 64. The preferred embodiment of FIGS. 22 and 23 may also be viewed as a combination of the basic features of FIGS. 16 and 17 with lateral reflecting surfaces or mirrors 78, 79, 81 and 82 arranged symmetrically to the light source 54 to supplement the light band projected by the equipment of FIGS. 16 and 17 by lateral light bands projected via regions 62 and 68. In this respect, the teachings of FIGS. 14 and 15 may be applied to the apparatus of FIGS. 22 and 23, in that the optical means 149 may be considered symbolic not only of the cylindrical lens 149 of FIGS. 16 and 17, but also of the Fresnel lens shown in FIGS. 14 and 15.

In other words, a Fresnel lens may, if desired, be employed at 149 in the apparatus of FIGS. 22 and 23.

As before, the reflector 83 and lens 75 cooperate in emitting the third part 74 of the light output in the form of a sheet of light which is divergent as seen in FIGS. 22 and 23. The cylindrical or Fresnel lens 149 then collimates light from the divergent sheet into a band of light extending over the third portion 73 of the elongate second region 64.

Even though FIG. 23, for the sake of clarity, shows some lateral distance between the arrowheads designating adjacent portions of the second region parts 63, 72 and 73, it should be understood that the apparatus of FIGS. 22 and 23 provides one essentially continuous light band at least along the electrooptically active portion of the light gate assembly 105. The method and apparatus shown in FIGS. 22 and 23 for converting a spatially concentrated light output from a point source 54 into a band of light extending along the second region 64 has utility not only in the context of the remainder of the illustrated oscillograph apparatus, but also is of independent utility in converting a spatially concentrated light output into a band of light.

In the specific context of FIGS. 22 and 23, the generated band of light is applied to the light gate assembly 105 which is electrically operated to provide an oscillograph trace 120 or other desired record of information input signals, as disclosed above.

By way of example, the band-type illumination system of FIGS. 22 and 23 may alternatively be employed for reading recorded information, such as has been disclosed in connection with FIGS. 18 and 19.

The principles of FIGS. 22 and 23 may thus, for instance, be employed for the purpose of converting a spatially concentrated light output into a band of light, of recording varying electric signals, or of reading information perceptible upon illumination, as may be desired.

As in FIGS. 5 and 6, folded light path systems of the type shown in FIGS. 9 and 10 may be employed in the apparatus of FIGS. 22 and 23 in substitution or modification of the lateral light band producing means 78 and 81.

The subject extensive disclosure will suggest or render apparent various modifications and variations within the spirit and scope of the invention to those skilled in the art.

I claim:

1. In a method of recording varying electric signals with a plurality of electrically actuable light gates, the improvement comprising in combination the steps of:
    illuminating said light gates with light of a first intensity above zero light intensity;
    providing a light-sensitive recording medium sensitive to illumination levels at light intensities including said first light intensity and starting at a second light intensity below said first intensity and above zero light intensity:
    preconditioning said light gates to subsequent opening in response to said varying electric signals by electrically biasing said light gates to an initially open condition wherein said gates pass light from said illumination at an intensity above zero light intensity and below said second light intensity;
    exposing said recording medium to said light passed by said preconditioned gates in said initially open condition whereby said recording medium is exposed to light below said second intensity;

selectively energizing and further opening said preconditioned light gates in response to said varying electric signals to pass light from said illumination at at least said second light intensity and provide a luminous representation of said varying electric signals; and exposing said recording medium to said passed illumination at at least said second light intensity and recording said luminous representation of said varying electric signals on said recording medium.

2. A method as claimed in claim 103, including the steps of:

providing an electric bias having a first voltage for biasing said light gates to said initially open condition;

biasing said light gates to said initially open condition with said electric bias having said first voltage;

providing said varying electric signals with a second voltage only capable by itself of opening said light gates to pass light from said illumination at a level below said second light intensity, but capable in combination with said electric bias having said first voltage of opening said light gates to pass light from said illumination at at least said second light intensity;

combining said varying electric signals having said second voltage with said electric bias having said first voltage to provide driving signals for said light gates having a third voltage capable of opening said light gates to pass light from said illumination at at least said second light intensity; and selectively energizing and further opening said light gates with said driving signals having said third voltage to pass light from said illumination at at least said second light intensity and provide a luminous representation of said varying electric signals recordable on said recording medium.

3. A method as claimed in claim 2, wherein:

said light gates are arranged side by side in an elongate light gate array; and said illumination of light gates with light of a first intensity above zero light intensity includes the steps of:

emitting divergent light from a spatially concentrated source of light into a sheet of light having an elongate cross-section of sufficient width in its direction of elongation to illuminate said elongate light gate array upon collimation;

collimating said divergent light from said sheet into a collimated band of light; and illuminating said elongate light gate array with said collimated band of light.

4. A method as claimed in claim 1, wherein:

said light gates are arranged side by side in an elongate light gate array; and said illumination of light gates with light of a first intensity above zero light intensity includes the steps of:

emitting divergent light from a spatially concentrated source of light into a sheet of light having an elongate cross-section of sufficient width in its direction of elongation to illuminate said elongate light gate array upon collimation;

collimating said divergent light from said sheet into a collimated band of light; and illuminating said elongate light gate array with said collimated band of light.

5. In apparatus for recording varying electric signals, the improvement comprising in combination:

a plurality of electrically actuable light gates;

means for illuminating said light gates with light of a first intensity above zero light intensity;

a light-sensitive recording medium sensitive to illumination levels at light intensities including said first light intensity and starting at a second light intensity below said first intensity and above zero light intensity;

means connected to said light gates for preconditioning said light gates to subsequent opening in response to said varying electric signals, said preconditioning means including means for electrically biasing said light gates to an initially open condition wherein said gates pass light from said illumination at an intensity above zero light intensity and below said second light intensity;

means connected to said light gates for selectively energizing and further opening said preconditioned light gates in response to said varying electric signals to pass light from said illumination at at least said second light intensity and provide a luminous representation of said varying electric signals; and means for exposing said recording medium to said light passed by said preconditioned gates in said initially open condition whereby said recording medium is exposed to light below said second intensity and to said passed illumination at at least said second light intensity and recording said luminous representation of said varying electric signals on said recording medium.

6. Apparatus as claimed in claim 5, wherein:

said biasing means include means for providing an electric bias having a first voltage for biasing said light gates to said initially open condition, and for biasing said light gates to said initially open condition with said electric bias having said first voltage; and said selectively energizing means include means for providing said varying electric signals with a second voltage only capable by itself of opening said light gates to pass light from said illumination at a level below said second light intensity, but capable in combination with said electric bias having said first voltage of opening said light gates to pass light from said illumination at at least said second light intensity, and means for combinging said varying electric signals having said second voltage with said electric bias having said first voltage to provide driving signals for said light gates having a third voltage capable of opening said light gates to pass light from said illumination at at least said second light intensity and for selectively energizing and further opening said light gates with said driving signals having said third voltage to pass light from said illumination at at least said second light intensity and provide a luminous representation of said varying electric signals recordable on said recording medium.

7. Apparatus as claimed in claim 6, wherein:

said light gates are arranged side by side in an elongate light gate array; and said means for illuminating said light gates with light of a first intensity include:

means for emitting divergent light from a spatially concentrated source of light into a sheet of light having an elongate cross-section of sufficient width in its direction of elongation to illuminate said elongate light gate array upon collimation; and means for collimating said divergent light from said sheet into a collimated band of light and for illuminating said elongate light gate array with said collimated band of light.

8. Apparatus as claimed in claim 5, wherein:

said light gates are arranged side by side in an elongate light gate array; and said means for illuminating said light gates with light of a first intensity include:

means for emitting divergent light from a spatially concentrated source of light into a sheet of light having an elongate cross-section of sufficient width in its direction of elongation to illuminate said elongate light gate array upon collimation; and means for collimating said divergent light from said sheet into a collimated band of light and for illuminating said elongate light gate array with said collimated band of light.

* * * * *